US007279239B2

(12) United States Patent
Akedo et al.

(10) Patent No.: US 7,279,239 B2
(45) Date of Patent: Oct. 9, 2007

(54) LAMINATING PRODUCT INCLUDING ADHESION LAYER AND LAMINATE PRODUCT INCLUDING PROTECTIVE FILM

(75) Inventors: Kunio Akedo, Seto (JP); Koji Noda, Haguri-gun (JP); Atsushi Miura, Nagoya (JP); Hisayoshi Fujikawa, Seto (JP); Yasunori Taga, Nagoya (JP)

(73) Assignee: Kabushiki Kaisha Toyota Chuo Kenkyusho, Aichi-gun (JP)

( * ) Notice: Subject to any disclaimer, the term of this patent is extended or adjusted under 35 U.S.C. 154(b) by 329 days.

(21) Appl. No.: 10/491,431

(22) PCT Filed: Aug. 7, 2003

(86) PCT No.: PCT/JP03/10053

§ 371 (c)(1),
(2), (4) Date: Apr. 12, 2004

(87) PCT Pub. No.: WO2004/014644

PCT Pub. Date: Feb. 19, 2004

(65) Prior Publication Data

US 2004/0247949 A1    Dec. 9, 2004

(30) Foreign Application Priority Data

Aug. 7, 2002 (JP) ............... 2002-229914
Aug. 26, 2002 (JP) ............... 2002-245447

(51) Int. Cl.
*B32B 9/00* (2006.01)
*H01L 51/50* (2006.01)

(52) U.S. Cl. ............... 428/704; 428/1.1; 428/332; 428/411.1; 428/917; 313/112; 313/512; 257/100; 257/729; 257/98

(58) Field of Classification Search ............... 428/704, 428/1.1, 332, 411.1, 917; 257/100, 729, 257/98; 313/112, 512
See application file for complete search history.

(56) References Cited

U.S. PATENT DOCUMENTS

| 5,686,360 A | 11/1997 | Harvey, III et al. |
| 5,946,601 A * | 8/1999 | Wong et al. ............... 438/783 |
| 6,132,280 A * | 10/2000 | Tanabe et al. ............... 445/58 |
| 6,245,417 B1 | 6/2001 | Huang |
| 6,522,067 B1 * | 2/2003 | Graff et al. ............... 313/512 |
| 6,537,686 B1 * | 3/2003 | Chen ............... 428/678 |
| 6,573,652 B1 * | 6/2003 | Graff et al. ............... 313/512 |
| 2002/0132131 A1 | 9/2002 | Bossmann et al. |

FOREIGN PATENT DOCUMENTS

| EP | 1 217 095 A1 | 6/2002 |
| JP | 63-259994 | 10/1988 |
| JP | 7-161474 | 6/1995 |
| JP | 2636734 | 4/1997 |
| JP | 10-319226 | 12/1998 |
| JP | 11-170528 | 6/1999 |
| JP | 2000-285437 | 10/2000 |
| JP | 2001-345174 | 12/2001 |
| JP | 2002-502081 | 1/2002 |
| JP | 2002-117973 | 4/2002 |
| JP | 2002-241961 | 8/2002 |
| JP | 2003-282237 | 10/2003 |
| WO | 99/03099 | 1/1999 |

* cited by examiner

*Primary Examiner*—Dawn Garrett
(74) *Attorney, Agent, or Firm*—Oblon, Spivak, McClelland, Maier & Neustadt, P.C.

(57) ABSTRACT

In a laminate product formed by an organic member and/or an inorganic member, high strength adhesion between the organic member and the inorganic member is achieved by providing an adhesion layer which includes amorphous carbon nitride (a-CNx:H) particularly between the organic member and the inorganic member. Further, in order to protect a laminate product formed by an organic member and/or an inorganic member, for example, an organic electronic element including an organic compound layer, such as an organic electroluminescence element, a protective film including at least amorphous carbon nitride and a protective layer having a laminate structure formed by sandwiching a vapor deposition inorganic film between plasma polymerized films are used. Thus, a protective film which is optimum to an organic electronic element, having high bending stress resistance, high shielding effect against moisture and oxygen existing in the air, and excellent resistance to high temperature and high humidity can be provided.

7 Claims, 9 Drawing Sheets

LAMINATING PRODUCT INCLUDING ADHESION LAYER AND LAMINATE PRODUCT INCLUDING PROTECTIVE FILM

TECHNICAL FIELD

The present invention relates to an adhesion layer for improving an adhesive property of a laminate product and a protective film for protecting a laminate product.

BACKGROUND ART

Laminate structures which is composed of a plurality of thin films formed on a base member are employed in a variety of technical fields. For example, a thin film is formed on a base member made of an inorganic or organic material, thereby forming an electronic device or protecting a surface of the base member as a protective film.

In such a laminate structure, high adhesive strength of the thin film to the base member surface is often required so as to ensure reliability of the device, or for other reasons. Accordingly, in order to enhance the adhesion, various methods have been proposed, such as cleaning the base member surface or improving the surface quality, and providing an adhesion layer between the base member and the thin film.

Cleaning of the base member surface is commonly performed through a base member washing treatment employing an organic solvent, acid, or alkali, a UV ozone treatment, or a plasma treatment, as examples. These treatments are usually performed as the thin film is formed on a glass substrate or an inorganic material substrate such as an Si substrate, and some of the washing methods improve the surface state, as described in "Thin Film" by Sadafumi Yoshida (Baifukan, 1990).

With regard to improvement of surface quality of a base member, a method has been provided for partially carbonizing a color filter or an organic protective film which is formed covering the color film, so as to enhance adhesion between the color film and a transparent electrode made of an ITO (Indium Tin Oxide) film which are formed on a glass substrate provided on one side of a liquid crystal panel, for example. Japanese Patent Laid-Open Publication No. Hei 10-319226 describes, for example, formation of a carbonized layer between a color filter and a transparent electrode by exposing the color filter or an organic protective film formed on the color filter to DC-plasma or RF-plasma for a short period of time or applying, before an adhesion layer is formed, ion irradiation to the color filter or the organic protective film which have been formed. The above publication describes that with such a carbonized layer, the protective function of the base layer is improved and also adhesion of the base layer with respect to the adhesion layer and the transparent electrode, which are formed above the base layer, can be enhanced.

Formation of an adhesion layer between a base member and a thin film includes cases in which, for example, a hard coat layer is formed on a surface of plastic lens. Plastic lens is a soft material and must therefore to be covered with a hard coat layer for surface protection. However, because adhesion between the plastic lens and the hard coat material is low, in many cases, sufficient durability cannot be secured when a hard coat layer is formed directly on the lens surface. To address this problem, Japanese Patent Laid-Open Publication No. 2000-205305 proposes that a primer layer made of metal oxide particles dispersed in a resin is coated and dried on the plastic lens surface and then an adhesion layer is formed. It is reported that adhesion of a hard coat layer to the plastic lens can be enhanced by thus forming a primer layer on the plastic lens surface and then forming a hard coat layer thereon.

Further, in the field of a semiconductor devices or the like, it is required that a polymer resin having a relative dielectric constant lower than that of an inorganic film be used for an insulating film such as an inter-layer insulating film. However, sufficient adhesion cannot be secured between an insulating layer made of a polymer resin and metal lines. In order to deal with this problem, Japanese Patent Laid-Open Publication No. Hei 6-283615, for example, discloses that an adhesion layer made of an amorphous fluorocarbon polymer with many dangling bonds is interposed between an insulating layer made of the above-described polymer resin and a metal layer (including a metal line).

In addition, recently, there has been an increasing demand for a lighter and thinner electronic device which is formed on a plastic substrate used in place of a glass substrate. Because a plastic material cannot provide high shielding property against foreign impurities (such as water and oxygen) which an electronic device wishes to avoid, it is necessary to form a barrier layer between the substrate and the electronic device. However, adhesion between the plastic substrate and the barrier layer remains low and requires further improvement. In this regard, Japanese Patent Laid-Open Publication No. 2002-18994 proposes provision of an adhesion layer made of Si or the like between the plastic layer and the barrier layer, and reports that adhesion between the plastic substrate and the barrier layer is increased due to the provision of the adhesion layer.

Improvement in the state of a substrate surface can be recognized when a washing treatment using an organic solvent or acid and alkali, and an UV ozone treatment or a plasma treatment are employed with respect to a substrate surface. However, organic base members such as a plastic substrate and a film substrate are often eroded by chemicals such as an organic solvent, acid, and alkali, and therefore cannot be washed sufficiently to remove all foreign substances and contaminants from the surface. Further, however the surface of the base member is cleaned, such cleaning will not improve the inherent adhesiveness between materials having a low chemical bonding power.

According to the plasma treatment of organic base members such as a plastic substrate and a film substrate, although the nature of the surface can be modified, due to high plasma energy, a modified layer is formed through the layers to a region which is rather far from the surface, and therefore the original property of the substrate is often lost. Moreover, when a plasma treatment is performed using a mixture of discharge gas and oxidizing gas such as oxygen so as to increase cleanness of the substrate, ashing is performed through the layers to a deep portion far from the substrate surface, and also evenness of the substrate surface is lost.

With a primer layer as described in the above Japanese Patent Laid-Open Publication No. 2000-206305, formation of a uniform and precise thin film remains an industrially difficult task, and in many cases, the resulting film cannot maintain sufficient adhesive force under severe environment and is peeled off. Also, in optical element and light emissive element applications it is necessary that an adhesion layer be optically transparent, which is difficult with either a transparent metal thin film or a Si film.

In addition, with the use of amorphous fluorocarbon polymer having many dangling bonds as an adhesion layer, adhesion between an insulating layer made of a polymer resin and such an amorphous fluorocarbon polymer layer is enhanced, resulting in an increased adhesion strength between the insulating layer and a metal layer. However, because fluorocarbon polymer, even in an amorphous state, includes substantially no elements which form strong chemical bonding between layers, it cannot maintain a sufficient adhesion force in a more severe environment, with the result that metal layers are often peeled off.

As described above, none of the above-described conventional methods are sufficient to improve adhesion between layers. Further, with the variety of types of base members and thin film materials which are used today, there is a strong demand that high adhesion (a high level of adhesive strength) be provided with respect to a variety of materials and that adhesion between layers be maintained even in a severe environment.

Further, in a laminate structure in which one or more thin films made of an inorganic or organic material are formed on a base member made of an inorganic or organic material, a protective film which is formed so as to protect the laminated thin films from erosion by moisture, oxygen and corrosive gas existing in the air and from mixture of impurities or the like is required in a variety of technical fields. However, with the progress of diversification of base members and development of a device such as an organic electroluminescence element including a mixture of an inorganic material layer and an organic material layer, in addition to excellent shielding ability against foreign materials or high strength, further functions are required for these devices and the film itself which directly covers the base member for protection. For example, an ability to cover a device or a base member, as the object of protection, with high adhesion and stability for a long period whether or not the protection object is made of an organic material or an inorganic material, and an ability to prevent damage to the protection object and significant stress generated with respect to the protection object when forming the protective layer are required. However, while protective films preferably providing one of the two abilities has been proposed, no protective layers having the combination of functions described above, especially those functions which require trade-off have yet been proposed.

In order to solve the above problems, the present invention has an advantage of realizing an adhesion layer, a protective layer, or the like, which can be applied to either an organic material or an inorganic material.

DISCLOSURE OF THE INVENTION

In order to achieve the above objects, in accordance with one aspect of the present invention, an organic/inorganic laminate structure having an organic member formed on an inorganic member comprises an adhesion layer at an interface between the inorganic member and the organic member, and the adhesion layer includes amorphous carbon nitride.

In accordance with another aspect of the present invention, an organic/inorganic laminate structure having an inorganic member formed on an organic member comprises an adhesion layer at an interface between the organic member and the inorganic member, and the adhesion layer includes amorphous carbon nitride.

When an organic member is formed on an inorganic member, or an inorganic member is formed on an organic member, in addition to the internal stress contained in each material layer which is formed, a stress caused by a difference of coefficient of expansion is further applied to each layer, especially in a severe environment such as high temperature and high humidity. In addition, because most combinations of an inorganic member and an organic member provide a poor interface adhesion, there is a problem of peel-off and cracks. It is therefore necessary to improve adhesion at the interface between the inorganic member and the organic member.

In accordance with another aspect of the present invention, there is provided a laminate product having an adhesive and a base member, at least a surface of which has difficultly to adhere to the adhesive, wherein an adhesion layer is provided between the adhesive and the base member and the adhesion layer includes amorphous carbon nitride.

The low adhesion between an inorganic material and an organic material results from the facts that a chemical bonding force of these materials is weak and therefore the bonding force at the interface depends on the van der Waals force, and further that the van der Waals force acting on the interface by itself is not very large because an organic material generally has a low density. In addition, poor wettablity between an organic material and an inorganic material is another cause of such low adhesion.

Low adhesion between the base member and the adhesive also results because the chemical bonding force of these materials is weak, and therefore the bonding force at the interface depends on the van der Waal forces, and further because the van der Waals force is relatively small when the adhesive has a low density.

Even when a combination of materials provides a weak force acting at the interface of these materials as described above, it is possible to drastically increase the adhesion force by providing an adhesion layer including amorphous carbon nitride (a-CNx:H) between these materials. An amorphous carbon nitride film includes carbon as its main component, and therefore has excellent wettability and high adhesion with respect to the organic material. Also, because of the high density of the film, the amorphous carbon nitride film has high van der Waals forces acting with respect to the inorganic material. In addition, because the chemical bonding force with respect to the inorganic material is increased due to nitrogen atoms existing in the amorphous carbon nitride film, adhesion between the amorphous carbon nitride film and the inorganic member is increased.

Amorphous carbon nitride also exhibits high chemical bonding force with respect to a base member which is otherwise difficult to adhere to due to the existence of nitrogen atoms, and can achieve high adhesion whether the base member having difficulty to adhere is made of an inorganic material or an organic material. It is therefore possible to increase adhesion between the base member having difficulty to adhere and the adhesive by forming an adhesion layer including amorphous carbon nitride between these members.

In accordance with another aspect of the present invention, the adhesion layer including amorphous carbon nitride can be formed by a vapor deposition method using, as raw material, gas including one or more of alkane, alkene, and alkyne, and gas including nitrogen and ammonia.

Further, a plasma enhanced chemical vapor deposition method can be adopted as the vapor deposition method. By using a plasma enhanced chemical vapor deposition method, the amorphous carbon nitride film can be provided with a stronger chemical bonding and higher adhesion to the base member or the adhesive due to the effect of radicals and ions. Moreover, a vapor deposition method can facilitate formation of a film on a base member having a variety of shapes. Also, the method is applicable in a room temperature and can therefore have a wide range of applications.

In accordance with a further aspect of the present invention, in a laminate product formed by either one or both of an inorganic member and an organic member, an adhesion layer is provided between inorganic members or between inorganic members, or between the inorganic member and the organic member, and the adhesion layer includes amorphous carbon nitride.

In addition to the combinations of an organic member formed on an inorganic member and an inorganic member formed on an organic member, when an inorganic member is formed on an inorganic member and when an organic member is formed on an organic member, the adhesion at the interface of these members is sometimes low. In such a case, according to the present invention, it is possible to maintain adhesion between layers and prevent generation of peel-off, cracks or the like, especially under the severe environment of high temperature and high humidity.

In accordance with anther aspect of the present invention, in a laminate product as above, the organic member includes one or more of a single layer or a multi-layer thin film of an organic compound, a resin, and an adhesive.

In accordance with a further aspect of the present invention, in a laminate product as above, the organic member is an organic color element of a display element.

In accordance with a still further aspect of the present invention, in a laminate product as above, the organic color element is a color filter.

In accordance with a yet further aspect of the present invention, in a laminate product as above, the inorganic member is one or more of oxide, nitride, carbide, metal and a semiconductor.

In accordance with another aspect of the present invention, a surface of a laminate base member in which inorganic members or organic members, or an inorganic member and an organic member, are layered, is covered with a protective film, and the protective film includes amorphous carbon nitride.

With the provision of such a protective film, in any combination of the films, namely, an organic member formed on an inorganic member, an inorganic member formed on an organic member, an inorganic member formed on an inorganic member, and an organic member formed on an organic member, these thin films of the laminate structure can be covered with high adhesion, and can therefore be protected from erosion by moisture, oxygen, and corrosive gas in the surrounding atmosphere, and from the mixing in of impurities or the like.

In accordance with another aspect of the present invention, an organic electronic device comprises, on a base member, an organic electronic element including at least an electrode and an organic compound layer, and either one of or both a protective film which is formed covering the organic electronic element and a protective film which is formed between the organic electronic element and the base member, and the protective film includes amorphous carbon nitride.

In accordance with still another aspect of the present invention, in an organic electronic device as above, the protective film is a single film made of the amorphous carbon nitride or a laminate film formed by the amorphous carbon nitride an inorganic film.

In accordance with a further aspect of the present invention, in an organic electronic device as above, the film including amorphous carbon nitride is formed by a vapor deposition method using, as a raw material, gas including one or more of alkane, alkene, and alkyne, and gas including nitrogen and ammonia.

In a still further aspect of the present invention, in an organic electronic device as above, the inorganic film includes one or more of a nitride film, an oxide film, a carbon film, and a silicon film.

In yet a further aspect of the present invention, the inorganic film is one or more of a silicon nitride film, a boron nitride film, an aluminum nitride film, a silicon oxide film, an aluminum oxide film, a titanium oxide film, an amorphous silicon film, an amorphous carbon film, and a diamond like carbon film.

In another aspect of the present invention, in an organic electronic device as above, the protective film has a laminate structure formed by two or more layers including a film which includes the amorphous carbon nitride and the inorganic film, and the inorganic film is formed between the amorphous carbon nitride film and the organic electronic element.

As described above, durability of a device can be increased dramatically when at least a film including amorphous carbon nitride is used as a protective film for an organic electronic device. Amorphous carbon nitride has excellent flexibility and stress durability as an organic protective film, and functions as a stress relaxation film of the element. On the other hand, amorphous carbon nitride has a denseness which is similar to that of the inorganic film, and therefore has a very high shielding ability against moisture and oxygen. Further, because it is easy to control the stress characteristics of an amorphous carbon nitride film (a-CNx:H film) by controlling an amount of nitrogen (x) introduced into the film, a protective film having characteristics which meet application requirements can easily be formed.

Further, by providing a laminate structure formed by the amorphous silicon film and an inorganic film which uses a nitrogen film, an oxide film, a silicon film, a DLC film, or the like, it is possible to even further improve shielding against moisture and oxygen.

Moreover, the protective film for the organic electronic device is useful not only as a protective film covering the element formed on the substrate for externally protecting the element, but also, when provided between the substrate and the element, as a protective film for preventing intrusion of moisture or the like into the element from the substrate side.

In accordance with another aspect of the present invention, in an organic electronic device as above, the organic electronic element is an organic electroluminescence element having at least one layer including an organic compound between electrodes.

In accordance with still another aspect of the present invention, in an organic electronic device as above, the organic electronic element includes either an organic transistor or a liquid crystal element.

In accordance with a further aspect of the present invention, in an organic electronic device as above, the protective film includes the amorphous carbon nitride as a protective film having resistance to high temperature and high humidity.

In accordance with another aspect of the present invention, there is provided a manufacturing apparatus of an organic electroluminescence element including an element region having at least one organic compound layer between electrodes and a protective film covering at least the element region, the protective film having a laminate structure formed by an amorphous carbon nitride film and an inorganic film and covering the element region. The apparatus comprises an element film forming chamber for forming each layer which constitutes the element region, a protective film forming chamber for forming the amorphous carbon nitride film, and an inorganic film forming chamber for forming the inorganic film, and at least each protective film forming for forming the amorphous carbon nitride film or the inorganic film which is previously formed covering the element region, and the element film forming chamber are connected directly or via a transportation vacuum chamber.

With the above structure, it is possible to transport a substrate on which an organic EL element has been formed, to a protective film forming device without exposing the substrate to the atmosphere. By enabling transportation of the organic EL element to the protective film forming device without being exposed to the atmosphere, each layer can be laminated in-situ.

In accordance with another aspect of the present invention, an organic electronic device comprises, on a base member, an organic electronic element including at least an electrode and an organic compound layer, and either one of or both a protective film formed covering the organic electronic element and a protective film formed between the organic electronic element and the base member, and the protective film includes a lamination film in which a vapor deposition inorganic film and a plasma polymerized film which is formed using a material including at least one type of an organic compound are alternately layered and in which the vapor deposition inorganic film is sandwiched by the plasma polymerized films.

In the above organic electronic device, the plasma polymerized film can be formed by including any of amorphous carbon nitride, amorphous carbon, hetero five-membered ring organic compound polymer, fluorine organic compound polymer, chlorine organic compound polymer, acrylic organic compound polymer, and silicon organic compound polymer, for example. The vapor deposition inorganic film can be formed by including any of silicon nitride, boron nitride, aluminum nitride, silicon oxide, aluminum oxide, titanium oxide, amorphous silicon, and diamond like carbon, for example.

By adopting a multi-layer lamination film, formed by a plasma polymerized film including an organic compound and a vapor deposition inorganic film, as a protective film for an organic electronic element, the following advantages can be obtained. Specifically, the bending stress resistance is increased by forming a vapor deposition inorganic film which has high moisture proof property but has low bending stress resistance to have a small thickness and the moisture proof property which deteriorates accordingly can be compensated for by using a multi-layer structure formed with a plasma polymerized film including an organic compound with excellent stress relaxation and high bending stress resistance. Thus, in an organic electronic device of the present invention, it is possible to realize high bending stress resistance and high moisture proof property due to a protective film formed by multi-layer lamination layers.

Further, because the protective film of the present invention is formed by sandwiching the vapor deposition inorganic film between the plasma polymerized films, the plasma polymerized films provided above and below the vapor deposition inorganic film can reliably prevent stress concentration on the vapor deposition inorganic film. When a plasma polymerized film is provided only on one surface of the vapor deposition inorganic film, when these films are bent, stress is generated due to a characteristic difference between these films and stress concentration is generated in a step portion or a projecting portion. In particular, when stress concentration is caused in an inorganic film which has low bending stress resistance as described above, cracks are generated in the film, or peeling-off occurs at the film interface and moisture proof property is reduced. By providing plasma polymerized films having the same or similar characteristics sandwiching the vapor deposition inorganic film, the plasma polymerized films will provide an opposing effect with respect to the vapor deposition inorganic film interposed between them, reducing the likelihood of stress generation, providing a balancing effect, and thereby preventing stress concentration. Consequently, even when the base member is bent, generation of cracks or reduction in moisture proofing property can be prevented.

Also, when only one plasma polymerized film including an organic compound and only one vapor deposition inorganic film are laminated, thermal stress is generated due to a difference in thermal expansion coefficient between these films, resulting in warping of the protective film and stress concentration in a step portion or the like, where moisture resistance ability will easily be affected. However, by adopting, in a protective film, a laminate structure formed by sandwiching a vapor deposition inorganic film between plasma polymerized films as in the present invention, the thermal stress between the plasma polymerized film and the vapor deposition inorganic film can be balanced via the vapor deposition inorganic film. Accordingly, the protective film will not warp or bend, and cracks can be prevented. Further, deterioration of moisture resistance property in the protective film due to thermal stress can be prevented, and sufficient extension of life can also be achieved for an organic electronic element which is exposed to high temperature and high humidity conditions.

In addition, because the plasma polymerized film including an organic compound functions as a stress relaxation layer, the thermal stress between the plasma polymerized film and the vapor deposition inorganic film, between the plasma polymerized film and the organic electronic element, and between the plasma polymerized film and the substrate, can be relaxed by the plasma polymerized film, and the effect of thermal stress on the inorganic film or the element can be reduced, so that deterioration of element characteristics and reduction in moisture proofing property can both be prevented.

A protective film having a multi-layer laminate structure according to the present invention has both a high bending stress resistance and a superior moisture proofing property. Accordingly, even when an organic electronic element is formed on a substrate using a flexible material, increased reliability and extended service life can be achieved by covering the organic electronic element with a protective film as described above. Further, by forming the protective film of the present invention between the organic electronic element and the substrate, significant reduction in moisture resistance property due to generation of cracks at the time of bending the substrate or thermal stress is unlikely. It is therefore possible to reliably prevent intrusion of moisture and oxygen into the element from the substrate side.

Further, the protective film of the present invention covers the organic electronic element and is also formed between the substrate and the element region. It is therefore possible to prevent intrusion of external moisture and oxygen including those from the substrate, thereby more reliably protecting the organic electronic element.

In accordance with another aspect of the present invention, the thickness of each vapor deposition inorganic film layer in the lamination layer is 0.5 µm or less. Because the protective film of the present invention has a multi-layer laminate structure formed by a plasma polymerized film and a vapor deposition inorganic film, the protective film need not have a thickness of 0.5 μm or more, a characteristic which is necessary for covering the steps of the organic electronic film only with an inorganic film. Because an inorganic film has large a Young's modulus and large internal stress, cracks are easily generated when the film is bent or otherwise deformed, and such an influence is further increased when the inorganic film has a large thickness, as described above. By forming the inorganic film to have a thickness of 0.5 μm or less, however, the functionality of the protective film would not be deteriorated, and high bending stress resistance can be achieved while high moisture proof ability is maintained.

In a further aspect of the present invention, in the above organic electronic device, the number of layers in the lamination film is 50 or less.

In a still further aspect of the present invention, in the above organic electronic device, the total thickness of the lamination film equals to or greater than the total thickness of the organic electronic element, and is 10 μm or less.

Because both the plasma polymerized film and the vapor deposition inorganic film of the present invention are formed using a vapor deposition method, the films both demonstrate superior covering property with respect to the steps, in contrast to films formed by an evaporation method or the like. Also, because the protective film is formed by a lamination film, making the total thickness of the protective film equal to or greater than the total thickness of the organic electronic element, so that sufficient step covering can be achieved, is a simple process. Because a protective film having a thickness which is unnecessarily large is disadvantageous in view of manufacturing cost and because a total thickness of no more than 10 μm would be sufficient for the protective film, a maximum of 50 would be sufficient as the total number of laminated film layers in the protective film.

Further, an organic electronic element according to the present invention is applicable as an organic electroluminescence element, an organic transistor, and an element including a liquid crystal element, for example.

BRIEF DESCRIPTION OF THE DRAWINGS

These and other objects of the invention will be explained in the description below, in connection with the accompanying drawings, in which.

DETAILED EXPLANATION OF PREFERRED EMBODIMENTS

Preferred embodiments of the present invention will be described with reference to the drawings.

Embodiment 1

Figure 1:
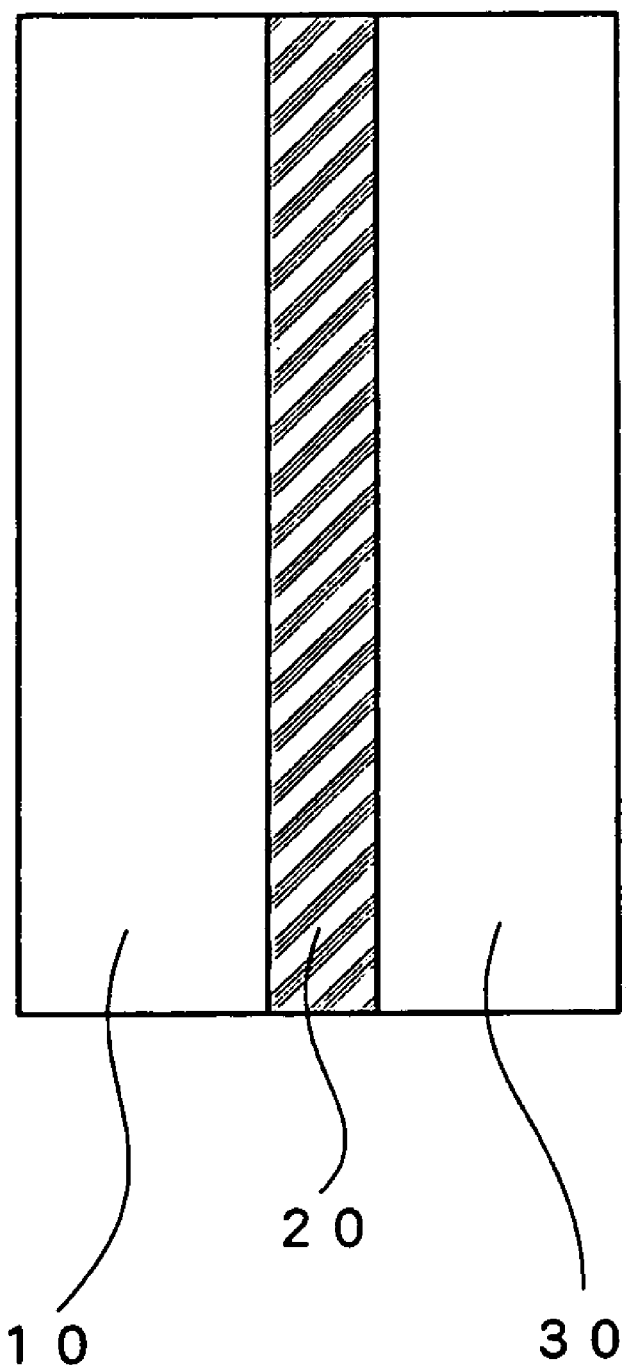
FIG. 1 is a view showing a structure of a laminate product according to a first embodiment of the present invention.

According to a first embodiment of the present invention, as shown in FIG. 1 a laminate product comprises an adhesion layer 20 including amorphous carbon nitride (a-CNx:H where x is an arbitrary number) at an interface of a laminate structure formed by an inorganic member 10 and an organic member 30. As described above, an amorphous carbon nitride film includes carbon as its main component, and therefore has excellent wettability and high adhesion with respect to organic material. Also, because high Van der Waals force acts between the adhesion layer and the inorganic material due to the high density of the adhesion layer, high adhesion can also be obtained between the adhesion layer and the inorganic layer. Further, because the adhesion layer is a dense layer with excellent surface covering property, its adhesion force can further be improved.

The inorganic member and the organic member may have a base member in any state, such as a thin film, a thick film, or a substrate having a desired shape. The laminate structure can be realized either by forming an organic member on an inorganic member, or by forming an inorganic member on an organic member. With the provision of the adhesion layer of the present embodiment, which is a film including amorphous carbon nitride, between the inorganic member and the organic member, it is possible to improve adhesion between the inorganic member and the organic member. Moreover, regardless of whether or not the base member is an inorganic member or an organic member, by forming an adhesion layer including amorphous carbon nitride between an adhesive and a base member, at least the surface of which exhibits a difficulty for adhering to the adhesive agent, adhesive force between the base member and the adhesive can be improved.

The inorganic member may include oxide, nitride, carbide, metal, semiconductor, or the like, and may be, for example, a glass substrate, a silicon oxide film, and a metal oxide film. It should be noted that although pure metals provide somewhat low adhesion to the adhesion layer of the present invention formed of amorphous carbon nitride, other inorganic materials can provide very high adhesion force.

The organic member may be a resin such as an acrylic resin, ester resin, carbonate resin, fluorocarbon resin, chlorine resin, epoxy resin, silicon compound resin, amide resin, imido resin, phenolic resin, melanin resin, ethylene resin, and propylene resin, an organic thin film such as a plasma polymeric film of an organic compound, and an adhesive such as epoxy adhesive, ultraviolet curing adhesive, and thermosetting adhesive.

In the first embodiment, the laminate structure can be applied either to a laminate structure in which a material film and an adhesive are layered on a base member (substrate) having a flat surface, a curved surface or any shape in accordance with its usage, or to a laminate structure formed by a plurality of material films.

The adhesion layer including amorphous carbon nitride can be formed by a vapor deposition method using, as a raw material, gas including at least one or more of alkane, alkene, and alkyne, and gas including nitrogen or ammonia, and can be formed by plasma enhanced chemical vapor deposition using methane gas and nitrogen gas as raw materials. The thickness of the adhesion layer is not particularly limited, and may be approximately between 50 nm to 300 nm, for example. When the adhesion layer is too thin, it becomes non-uniform or has low covering property. Even when the adhesion layer is thicker than necessary, on the other hand, adhesion is not increased accordingly, and therefore the adhesion layer should preferably have an appropriate thickness. Further, a plasma polymerized film made of amorphous carbon nitride is colored, though slightly, when it has a thickness of approximately 300 nm or more. Therefore, it is preferable to use a plasma polymerized film having such a thickness as an adhesion layer for an optical element and to use a plasma polymeric film having approximately 300 nm or less when a transparency is required for the film.

Embodiment 2

A second embodiment will be described. While amorphous carbon nitride (a-CNx:H) is used for an adhesion layer in the above first embodiment, in the second embodiment of the present invention, amorphous carbon nitride including hydrogen is used as a protective film. More specifically, a protective film covering a surface of a laminate base member in which inorganic members, organic members, or inorganic and organic member are lamimated, includes amorphous carbon nitride.

In any combination of films, namely, an organic member formed on an inorganic member, an inorganic member formed on an organic member, an inorganic member formed on an inorganic member, and an organic member formed on an organic member, when such a protective film is provided, the thin films of the laminate structure can be covered with high adhesion, and can therefore be protected from erosion by moisture, oxygen, and corrosive gas existing in the air and from mixture of impurities or the like.

Organic electronic devices using an organic compound as a functional material, such as organic electroluminescence elements (hereinafter referred to as "organic EL elements"), for example, have been noted and studied. Because an organic compound has a higher degree of freedom for molecular design in accordance with the function compared to an inorganic compound, light emissive elements emitting various colors can be realized by an organic electronic element using such an organic compound, and realization of a transistor with high mobility which can be formed at a low temperature can be expected.

In such an organic electronic element using an organic compound, it is known that an organic compound layer is vulnerable to erosion by moisture and oxygen in the air. For example, an organic EL element, under the existence of moistures and oxygen, suffers from deterioration such as generation of dark spots and short-circuit of the element. Accordingly, in order to prevent such deterioration and protect the organic EL element, a method has been employed for sealing the whole element with a cover glass, a can package, or the like, in an atmosphere of dry nitrogen, argon gas, or the like.

Further, in order to enlarge an element panel in a simple manner with a low cost, a method of covering the entire organic EL element with a protective film has been proposed. Use of amorphous carbon (Japanese Patent Laid Open Publications No. Sho 63-259994 and No. Hei 7-161474), a silicon nitride film and silicon oxide film (Japanese Patent Laid Open Publication No. Hei 4-73886), and DLC (Diamond Like Carbon) (Japanese Patent Laid Open Publication No. Hei 5-101885), as well as amorphous silica (Japanese Patent Laid Open Publication No. Hei 5-335080), SiZnO.SiZnON (Japanese Patent Laid Open Publication No. Hei 8-96955) as a protective film, and use of polyparaxylene (Japanese Patent Laid Open Publication No. Hei 4-137483), polyurea (Japanese Patent Laid Open Publication No. Hei 8-222368), or the like, as an organic material, has been proposed.

A structure in which a plurality of protective layers are laminated has also been proposed. For example, a laminate structure composed of a layer which is formed by vapor deposition and a layer made of a photosetting resin (Japanese Patent Laid Open Publication No. Hei 4-267097) and a laminate structure composed of an inorganic protective film and a sealing resin (Japanese Patent Laid Open Publication No. Hei 11-40345) are reported.

Further, a structure in which an organic protective film and an inorganic oxygen absorbing film or an inorganic protective film are laminated is disclosed in Japanese Patent Laid Open Publications Nos. Hei 7-169567, Hei 7-192868, 2000-068050, and 2001-307873, for example.

In addition, use of "Barix" as a protective film for a substrate which is a flexible substrate is reported (DISPLAYS 22, 65 (2001)).

Installation of display devices which use the above-described organic EL element, for example, in various devices has been studied. In order to employ such a display device as a display device mounted in a vehicle (in-vehicle display), it is necessary that the device be adaptable to high temperature and high humidity conditions. Shielding of an organic EL element from moisture and oxygen using the protective film as described above is regarded as an essential technique for providing a thin and large organic EL display device at a low cost. In the in-vehicle application described above, however, it is necessary to reliably prevent the formation of cracks in a protective film and peeling-off of the protective film caused by thermal stress and hygroscopic stress under high temperature and high humidity. In order to avoid these phenomena, it is necessary that the protective film be a thin film having excellent stress durability and high adhesion force with respect to the organic EL element.

Also, there is a strong demand for increased resistance to high temperature and high humidity, not only in organic EL elements, but also in other organic electronic devices such as liquid crystal display devices and organic transistors or the like. Accordingly, it is required that a protective film be a thin film with excellent stress durability and high adhesion force with respect to an organic electronic device.

Further, when a flexible substrate formed by a plastic member is adopted as a base member for forming an element so as to realize an organic electronic device having flexibility for reducing weight and thickness or the like, sealing of the element using a cover glass and a can package is not possible, and it is therefore necessary to block moisture and oxygen using a protective film. Because a protective film of an organic electronic element which is formed on such a flexible substrate must have a stable property with respect to bending, such a protective film must have excellent bending stress durability and high stress relaxation property.

Heretofore, however, there did not exist a protective film which satisfied the above requirements.

Also, although inorganic protective films such as a silicon nitride film and a silicon oxide film, which are often used as a protective film in the semiconductor field, have high shielding property against moisture and oxygen in the air and high thermal conductivity, they have disadvantages that thermal stress is large due to a large Young's modulus and that they are made of a relatively fragile material and are therefore vulnerable to cracking. In particular, when such an inorganic protective film is used as a protective film for an organic EL element, it is necessary to set the thickness of the inorganic protective film to approximately 1 μm, at least greater than 0.5 μm, in order to increase moisture proof property. Such a thick inorganic protective film, however, suffers from problems that influence of stress on the film is actually increased, and that, under high temperature and high humidity conditions, not only the film is subjected to cracks, but also sufficient durability with respect to bending which is necessary cannot be obtained.

Organic protective films such as polyparaxylene and polyurea described above have excellent flexibility and can therefore provide high stress durability when they are adopted in an organic electronic element which is formed on a flexible substrate. However, because these films have low density and low shielding property against moisture and oxygen, they are not suitable as a protective film for an organic electronic element for in-vehicle use, for example.

A protective film formed by an amorphous carbon (a-C) film cannot be used for an element which is formed on a flexible substrate because of inherent problems such as, for example, that the film has poor adhesion to an organic electronic element, the stress on the film itself is difficult to control, and cracking and peeling-off results under high temperature and high humidity conditions.

In a case where an organic electronic element is covered with a combination of an inorganic protective film and a sealing resin, the moisture resistance property is insufficient when the thickness of the inorganic protective film is reduced, whereas the stress durability is lowered when the thickness of the inorganic protective film is increased. Because such a "trade-off" relationship exists between the characteristics, enhancement of moisture resistance property and enhancement of stress durability are incompatible.

Further, even in the above-described structure in which an organic protective film and an inorganic protective film are laminated as described in Japanese Patent Laid-Open Publication No. Hei 7-169567, because the above problems concerning each of an inorganic protective film and an organic protective film remain unsolved, the protecting function which is required cannot be offered when such a structure is simply adopted as a protective film for an organic electronic element using a flexible substrate.

Application of a protective film which uses "Barix" to a flexible substrate is reported, as described above. The protective film using "Barix" is formed by evaporation. However, an organic film formed by evaporation has low adhesion to an inorganic film, and has poor durability under high temperature and high humidity environment. Also, the covering property of such a film is inferior.

The protective film according to the second embodiment of the present invention differs from the conventional protective films described above, and can cover a laminate product formed by an organic member and an inorganic member with high adhesion. Further, the protective film of the second embodiment can suppress stress which causes cracking in a laminate product when forming the film and stress which is generated at an interface after film formation, and can also improve resistance to moisture.

Figure 3:
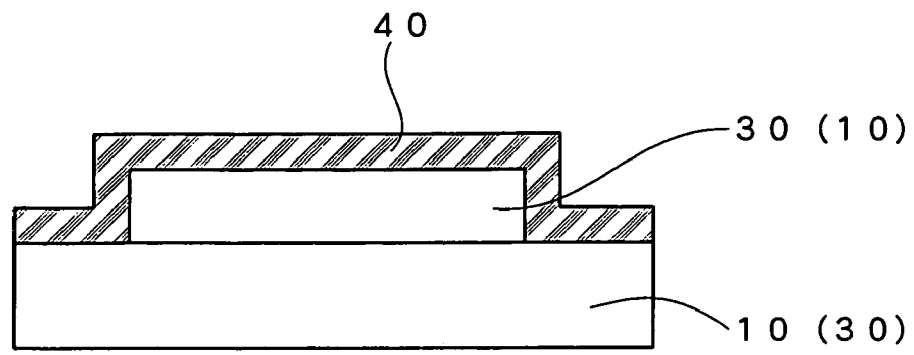
FIG. 3 is a view showing an application example of the protective film according to a second embodiment of the present invention.
Figure 4:
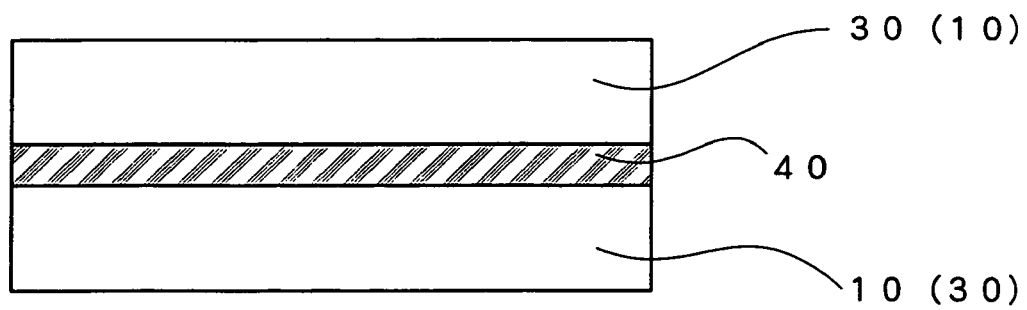
FIG. 4 is a view showing another application example of the protective film according to the second embodiment of the present invention.

In the second embodiment, as shown in FIG. 3, a laminate product comprises a protective film 40 including amorphous carbon nitride (a-CNx:H where x is an arbitrary number) so as to cover a laminate structure formed by an inorganic member 10 and/or an organic member 30. Alternatively, as shown in FIG. 4, a protective film 40 may also be provided in a laminate structure formed by an inorganic member 10 and/or an organic member 30, so that one inorganic member 10 and/or organic member 30 can be protected from erosion by moisture, oxygen, and corrosive gas and mixture of impurities from the other inorganic member 10 and/or organic member 30.

Figure 5:
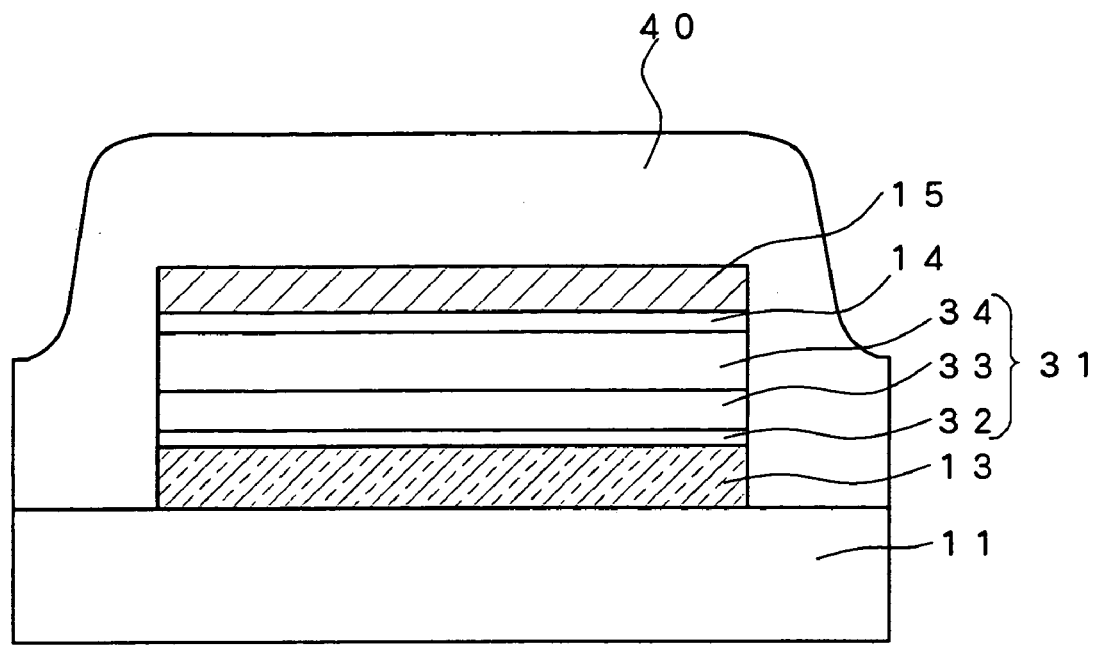
FIG. 5 is a schematic cross sectional view showing a structure of the organic EL element according to the second embodiment and an eighth example of the present invention.
Figure 6:
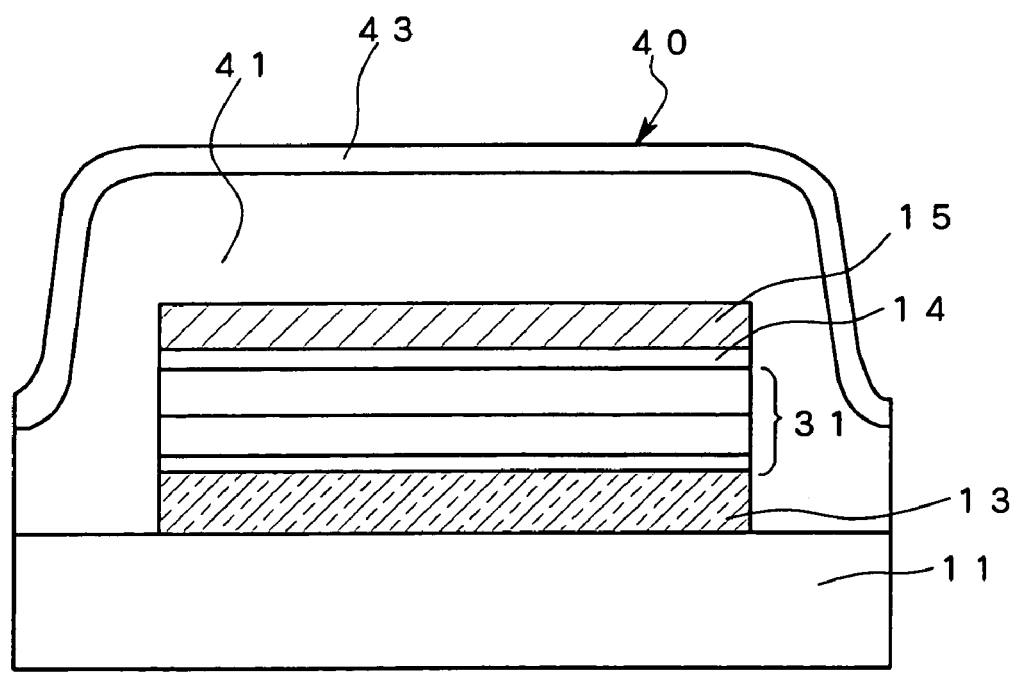
FIG. 6 is a schematic cross sectional view showing a structure of the organic EL element according to the second embodiment and a ninth example of the present invention.

FIG. 5 schematically shows a sectional structure of an organic electronic device according to the present invention, and FIG. 6 schematically shows a structure of an organic EL element which is used as an organic electronic element in FIG. 5. In the following description, an organic EL element will be mainly described as an example of an organic electronic element. A flexible material can be used as a material for a substrate 11, and various plastic materials including polyethylene terephthalete (PET), ester resin, acrylic resin, fluorocarbon resin can be used. Although it is necessary to use an optically transparent material for the substrate 11 when the organic EL element is configured to emit light through the substrate, an optically opaque material may be used when light is emitted from the element side. On the substrate 11, a first electrode 13, an organic compound layer 31, and a second electrode 15 are laminated to constitute an element region. The organic compound layer 31 includes at least an organic emissive material. Electrons and holes are injected from the first electrode 13 and the second electrode 15 into the organic compound layer, where the electrons and the holes are recombined to excite the organic emissive material, thereby emitting light. The substrate 11 may be formed by a transparent glass or plastic substrate. The materials used for the layers of the organic EL element formed on the substrate 11 are not particularly limited, and, for example, in addition to the materials which are conventionally proposed as materials for an organic EL element, new materials which will be developed in the future and any combination such new materials can also be used. As an example, the first electrode 13 functions as a hole injection electrode (anode) and is formed using a transparent electrode such as ITO (Indium Tin Oxide), and the second electrode 15 functions as an electron injection electrode (cathode) and may also have a laminate structure including an electron injecting layer 14 made of lithium fluoride (LiF) as shown in FIG. 6, in addition to a single-layer structure of a metal electrode such as Al. The organic compound layer 31 is configured to include at least an organic emissive material as described above, and may have either a single layer structure of an emissive layer, a two-layer structure including hole transport layer/emissive layer or emissive layer/electron transport layer, or the like, a three-layer structure including hole transport layer/emissive layer/electron transport layer, or a multi-layer structure further including a charge (hole, electron) injection layer, depending on the characteristics of an organic material or the like which is used. For example, as shown in FIG. 6, the organic compound layer 31 can be formed by, from the first electrode 13 side, a hole injection layer 32 made of copper phthalo cyanine (CuPc) or the like, a hole transport layer 33 made of triphenyl amine tetramer (TPTE) or the like, and an emissive layer 36 made of quinolinol aluminum complex ($Alq_3$), and can emit green light which originates from $Alq_3$. In the example shown in FIG. 5, a hole injection layer 32, a hole transport layer 33, and a hole transport layer 34 are sequentially laminated, in that order, between the first transparent electrode 13 and the second metal electrode 15. In FIG. 5, the second metal electrode 15 actually forms a laminate structure together with an electron injection layer 14 made of lithium fluoride which is formed on the surface of the second electrode 15 facing the hole transport layer 34.

In the second embodiment, the protective film 40 is formed covering the organic EL element having the above structure. As shown in FIG. 5, the protective film 40 is formed, after formation of the second electrode 15 which is the uppermost layer of the element, so as to cover the entire region of the element on the substrate 11, and protects the organic EL element from moisture and oxygen in the air. Amorphous carbon nitride (a-CNx:H) described above is used as a material for the protective film 40. An a-CNx:H film has a density similar to that of an inorganic film and therefore has high shielding property against moisture and oxygen in the air. Further, an a-CNx:H film has excellent covering property and evenness, and also has high stress durability because it has flexibility as an organic film and can reduce thermal stress and hygroscopic stress. In addition, because an element N contained in the a-CNx:H film increases bonding force to the base member, the a-CNx:H film can be realized as a film with low stress. Therefore, even when an a-CNx:H film is provided as a protective film for an organic EL element under high temperature and high humidity conditions, it is possible to prevent cracking and peeling-off. Further, the a-CNx:H film can be formed by plasma enhanced chemical vapor deposition using methane gas and nitrogen gas as raw materials, and is very advantageous in reducing a manufacturing cost of an organic EL element because methane gas and nitrogen gas which are raw materials are inexpensive and also a film forming device (plasma vapor deposition device) is also relatively inexpensive. Also, by controlling the ratio of the methane gas and the nitrogen gas which are raw materials, it is possible to adjust the ratio (x) of N in the film, so that the characteristics, particularly the stress or the like, of the a-CNX:H film which is formed in accordance with the N ratio can be controlled accurately. Accordingly, such an a-CNx:H film is very excellent as a protective film for an organic EL element.

The protective film 40 is not limited to a single layer structure including an a-CNx:H film as described above and shown in FIG. 5, and may alternatively be employed to form a laminate structure with other protective material film. When the protective film 40 forms a laminate structure with, for example, an inorganic protective film having high shielding property against moisture and oxygen, further improvement of the shielding property against moisture and oxygen and the stress relaxation ability become compatible, and adhesion to the organic EL element can be enhanced. Preferably, the inorganic protective film for use in combination with an a-CNx:H film is made thin, because the stress is increased when such an inorganic protective film is thick.

A nitride film, an oxide film, a carbon film, or a silicon film can be used as an inorganic protective film. More specifically, a silicon nitride film (SiN film), a boron nitride film, an aluminum nitride film, a silicon oxide film ($SiO_2$ film), an aluminum oxide film ($Al_2O_3$ film), a titanium oxide film ($TiO_2$ film, TiCO film or the like), an amorphous silicon film, an amorphous carbon film, or a diamond like carbon (DLC) film can be used.

As shown in FIG. 6, the protective film 40 can have another structure in which an a-CNx:H film 41 and a SiN film 43 are sequentially formed from the organic EL element side. By laminating the SiN film, which is a very dense film, on the a-CNx:H film, the ability of the protective film 40 to shield intrusion of moisture and oxygen from above the element can be enhanced. At the same time, adhesion between the SiN film 43 and the second electrode 15 can be enhanced, thereby improving reliability of the organic EL element.

Figure 7:
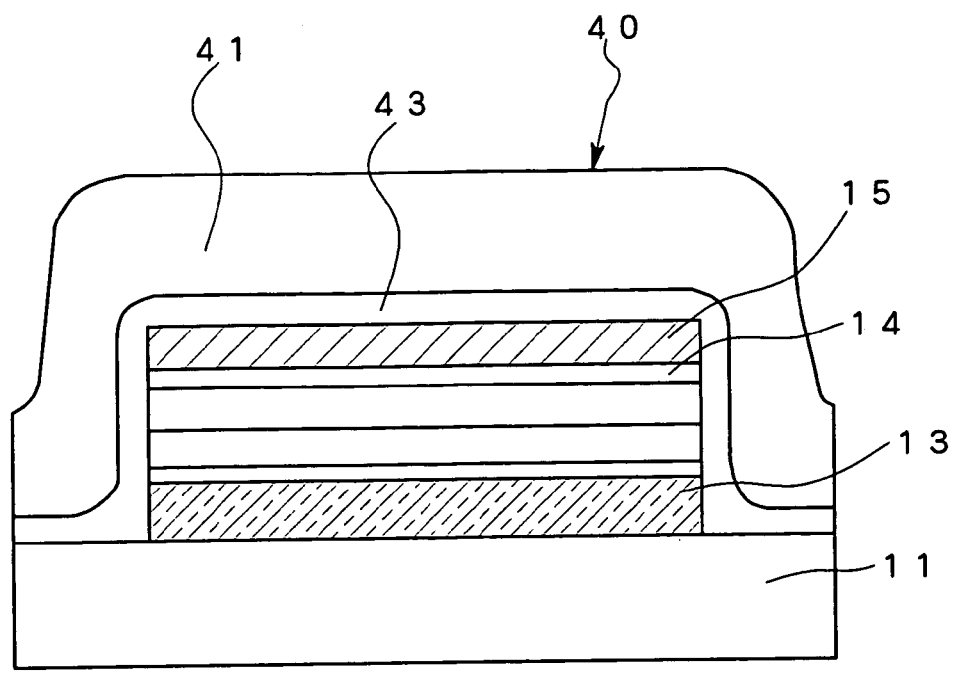
FIG. 7 is a schematic cross sectional view showing a structure of the organic EL element according to the second embodiment and a tenth example of the present invention.

Further, as shown in FIG. 7, the protective film 40 may adopt a laminate structure in which an inorganic protective film and an a-CNx:H film are laminated in the reversed manner. More specifically, the protective film 40 can be formed in the laminate structure in which a SiN film 43 and an a-CNx:H film 41 are sequentially formed in this order from the organic EL element side. Because the film structure of the a-CNx:H film is dependent on the underlying layer, when a dense film such as the SiN film 43 is used as the underlying film, the a-CNx:H film 41 which is formed thereon can be dense and have high shielding function against moisture and oxygen.

Moreover, a SiN film has high absorptivity with respect to the base member surface because silane, which is a raw material of the film, is chemically active. On the other hand, alkane gas, alkene gas, or the like of methane gas which is a raw material of the a-CNx:H film is not so active as silane. Accordingly, the a-CNx:H film has lower adhesion to the second electrode (metal electrode) 15 of the organic EL element than the SiN film. Consequently, by forming the SiN film below the a-CNx:H film, it is possible to cover the organic EL element with the SiN film with high adhesion and to form an a-CNx:H film having a superior quality on the SiN film, so that the resistance to high temperature and high humidity can be further increased. Also, there may be cases where particles of dust and waste are attached to the surface of the organic EL element at the time of forming the protective film. The SiN film 43 can be formed on such a particle surface with high adhesion in a manner similar to when it is formed on the organic EL element surface. By covering the SiN film 43 with the a-CNx:H film 41, even the region to which such particles are attached can be easily covered with the a-CNx:H film 41 having high evenness and high covering property. It is therefore possible to solve a problem of poor covering property of the protective film at these particle regions which allows intrusion of moisture and oxygen into the organic EL element through the discontinuous portions of the protective film.

Figure 8:
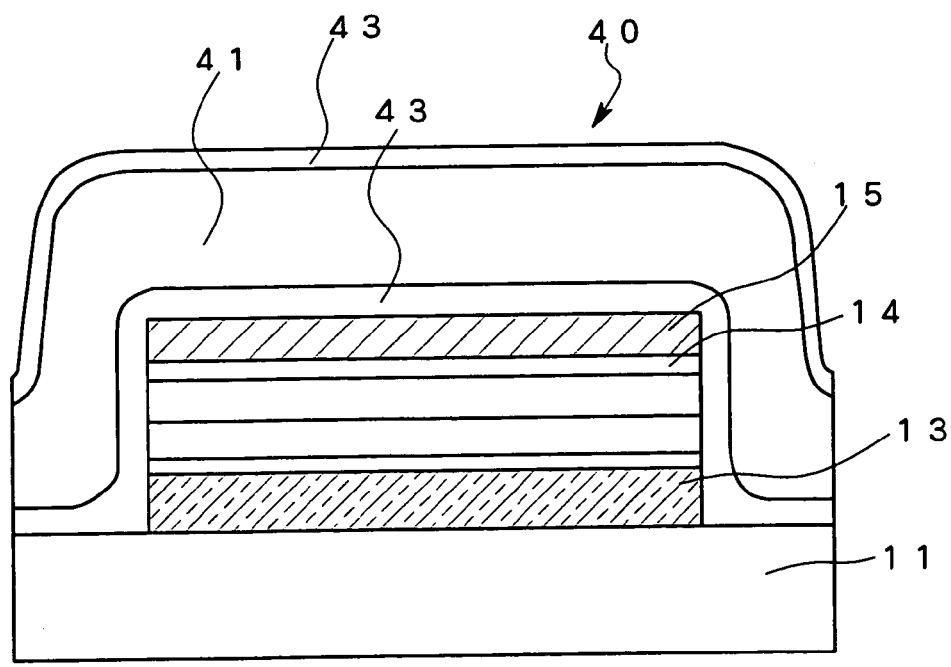
FIG. 8 is a schematic cross sectional view showing a structure of the organic EL element according to the second embodiment and an eleventh example of the present invention.

Further, in the protective film 40, an additional film having high shielding ability against moisture and oxygen, such as an inorganic protective film including a SiN film, for example, may further be formed above the a-CNx:H film shown in FIG. 7. FIG. 8 shows a protective film 40 having such a three-layer structure in which a SiN film 43, an a-CNx:H film 41, and a SiN film 43 are sequentially laminated in this order from the organic EL element side. Because the SiN film 43 is formed as the uppermost layer of the protective film, it is possible to prevent moisture or the like from entering from above the organic EL element more reliably. As in the case of the above-described example structure, it is preferable that this uppermost SiN film 43 is formed as a thin film in a range where the film has a shielding effect against moisture or the like and has a required strength, so as not to increase the stress in the film.

Alternatively, the protective film 40 may also be formed in a multi-layer structure in which more a-CNx:H films and more SiN films are laminated. This results in further increased reliability of the protective film.

Embodiment 3

Figure 9:
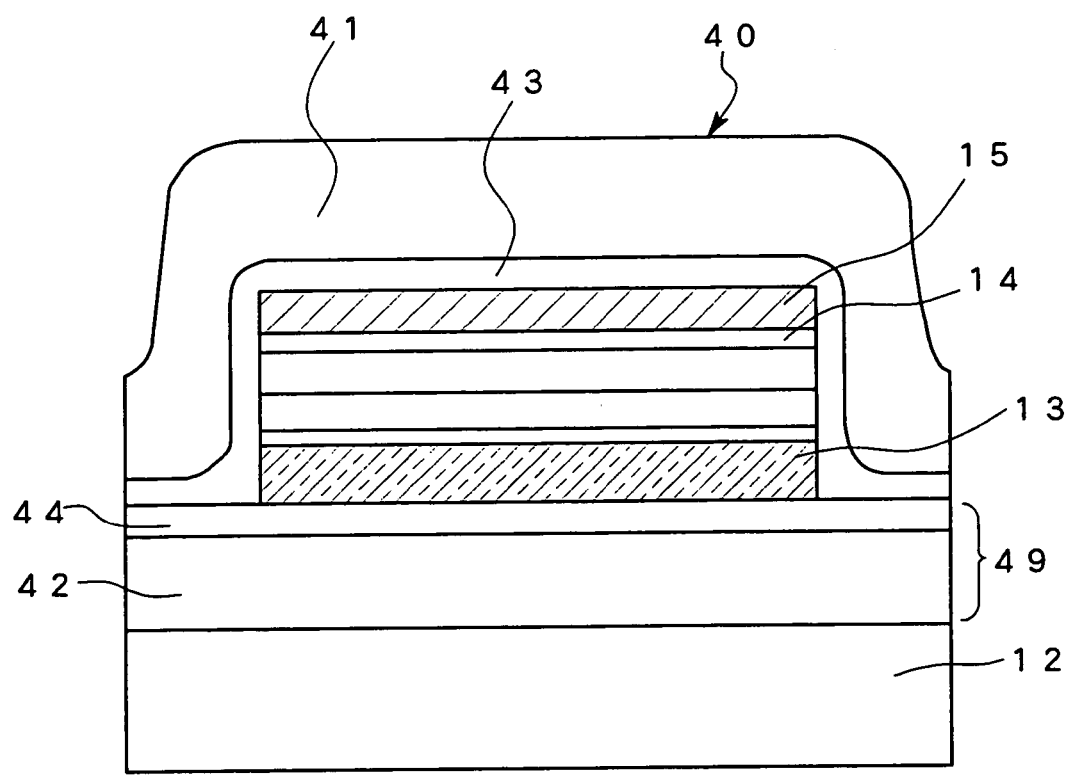
FIG. 9 is a schematic cross sectional view showing a structure of the organic EL element according to the second embodiment and a twelfth example of the present invention.

A third embodiment of the present invention will be described. FIG. 9 shows a schematic sectional structure of an organic EL element of the third embodiment. The third embodiment differs from the second embodiment in that, in the third embodiment, in addition to the protective film 40 which covers the organic EL element on the second electrode 15 side, the protective film (buffer layer) 49 is further formed between the substrate 12 and the organic EL element (the first electrode 13 in this example). When a substrate which has superior flexibility and is yet more inexpensive than a glass substrate, for example, a plastic substrate, is used as the substrate 12 for forming the element, it is necessary to prevent intrusion of moisture and oxygen from the substrate side because the plastic substrate has lower shielding property than that of the glass substrate. By forming the protective film 49 between the substrate 12 and the organic EL element as shown in FIG. 9, the organic EL element can be protected more reliably. The protective film 40 which covers the organic EL element may adopt a single layer structure including an a-CNx:H film and a multi-layer structure further including a SiN film or the like as described in the second embodiment.

It is preferable, both in respect to stress relaxation and moisture and oxygen shielding, that the protective film 49 is also formed by an a-CNx:H film. In this regard, the protective film 40 is not limited to a single layer structure of an a-CNx:H film, and more preferably has a laminate structure formed with a thin inorganic protective film such as a SiN film. As a laminate structure, a structure in which an a-CNx:H film and a SiN film are sequentially formed in this order from the substrate 12 side, a structure in which a SiN film and an a-CNx:H film are sequentially formed in this order from the substrate 12 side, or a multi-layer structure of these layers, for example, can be adopted.

Figure 10:
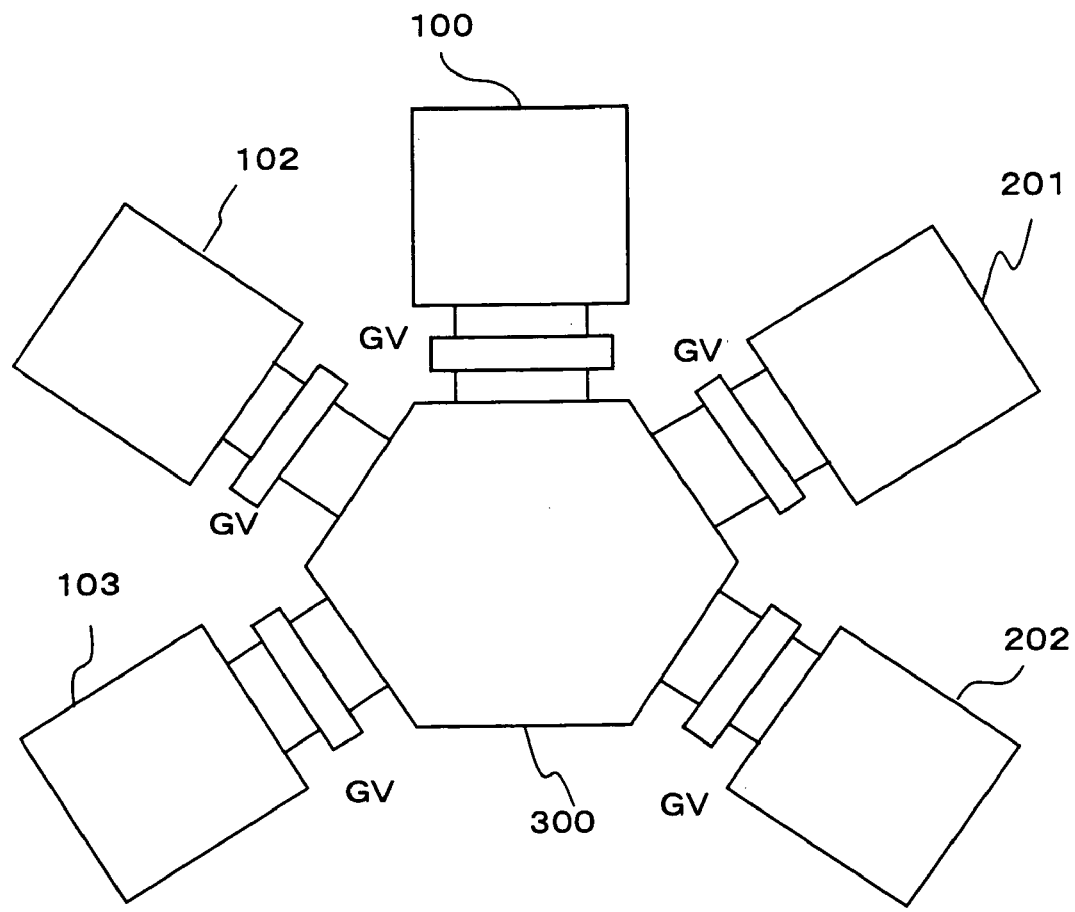
FIG. 10 is a view showing one example of an organic EL element manufacturing apparatus according to the present invention.

It is possible to form an organic EL element, which is covered with a protective film as described in the above second and third embodiments, by using a manufacturing apparatus shown in FIG. 10. In the manufacturing apparatus of FIG. 10, all the film forming chambers including element film forming chambers (an organic compound layer forming changer 102, a second electrode forming chamber 103), each forming each layer of an organic EL element having an organic layer between electrodes and film forming chambers for protective film to be formed on the element forming region (an inorganic protective film forming chamber 201, an a-CNxH forming chamber 202), are coupled to a common transportation vacuum apparatus 300 via the respective gate valves (GV), such that the whole apparatus has a cluster structure. A substrate introducing chamber and a substrate extracting chamber can be configured as a common chamber 100.

Such a cluster structure increases tolerance of the manufacturing apparatus for changing formation processes. For example, when it is desired to change the order of laminating films described in FIG. 6 to the reverse order shown in FIG. 7, or increase the number of laminate films in the protective film 40 as shown in FIG. 8, for example, the apparatus can easily deal with such changes. Further, the area required for setting the apparatus can be reduced easily. Of course, a so-called inline structure in which the element film forming chambers and film forming chambers for protective film are directly connected can also be adopted. Between the chambers, a gate valve is provided so as to make each chamber independent from each other chamber. With any of the above apparatus structures, it is possible to cover the element region with the protective film 40 without exposing the organic EL element to the ambient air after forming the organic compound layer which constitutes the organic EL element, so that the organic compound layer of the EL element which easily deteriorates when exposed to atmosphere can be reliably protected.

As described above, an a-CNx:H film forming a protective film can be formed using plasma enhanced chemical vapor deposition. Further, an inorganic protective film which forms a multi-layer structure together with the a-CNx:H film, such as a SiN film, for example, is preferably formed by a plasma CVD method. Of course, an inorganic protective film such as a SiN film and an $SiO_2$ film can be formed using a sputtering method which is used in a semiconductor device or the like. However, an organic El element which is more vulnerable to damages than a semiconductor device or the like is significantly damaged by sputtering. In addition, although the main role of a protective film is to shield the element from the ambient air, the density and coverage of the protective film obtained by sputtering is inferior to that obtained by plasma CVD. For these reasons, it is more preferable to form the inorganic protective film using a plasma CVD method. In particular, when a SiN film is formed on the organic EL element side as shown in FIGS. 7 and 8, the plasma CVD method is desired so as to prevent damage of the organic EL element.

In the above examples, it has been descried that the organic EL element is an object of protection by the protective film. However, the protective film using an amorphous carbon nitride material described above according to the embodiments of the present invention can similarly achieve a substantial effect, when it is used for protecting other elements whose functional material needs to be protected from moisture and oxygen in an organic electronic device, such as so-called organic transistor which uses an organic material as a material of the active layer.

Embodiment 4

A fourth embodiment of the present invention will be described with reference to FIGS. 11 and 12. According to the fourth embodiment, as a protective film for protecting an organic electronic element (an organic EL element, for example) 310 as described in the above second and third embodiments, a laminate film formed by laminating a plasma polymerized film 47 and a vapor deposition inorganic film 48 alternately to form a film of at least three layers including the plasma polymerized film 47 interposed between the chemical vapor deposition films 48 is used.

In the fourth embodiment, a protective film having such a multi-layer laminate structure is used both as a first protective film 45 formed between the substrate 12 and an organic EL element and as a second protective film 46 formed covering the organic EL element. However, a similar effect can be obtained when such a structure is used for only one of the first and second protective films 45, 46.

By adopting a protective film having the above-described laminate structure as the second protective film 46 which covers the organic EL element, in addition to the advantage of increasing the mechanical strength of the film to protect the organic EL element from the external impact, the advantage of reliably preventing deterioration of the organic EL element (the organic compound layer 31 in particular) by intrusion of foreign moisture and oxygen at the time of deformation of the substrate or even under high temperature and high humidity environment.

Further, because a flexible substrate 12 using a plastic material has higher permeability of moisture and oxygen than a glass substrate or the like, it is necessary to prevent moisture or the like from permeating into the substrate 12 and entering the organic EL element region. Thus, it is preferable to form a further protective film between the substrate 12 and the element region. Here, by providing a laminate film having a vapor deposition inorganic film interposed between plasma polymerized films as the first protective film 45 between the substrate 12 and the element, it is possible to prevent cracking and peeling-off of the film even when the substrate is deformed and also to prevent intrusion of moisture into the organic EL element region even under high temperature and high humidity conditions. Of course, the most effective results regarding both bending stress durability and moisture proof property can be obtained, when the above-described multi-layer laminate structure formed by a vapor deposition inorganic film and a plasma polymerized film is used for both the first and second protective films 45 and 46.

As the plasma polymerized film 47, a plasma polymerized film including any of amorphous carbon nitride, amorphous carbon, hetero five-membered ring plasma polymer such as furan and pyrrole, methacrylic acid methyl plasma polymer, acrylic organic compound plasma polymer such as acrylonitrile plasma polymer, fluorine organic compound plasma polymer such as tetrafluoroethylene plasma polymer, chlorine organic compound polymer such as dichloroethylene plasma polymer, tetra ethoxy silicon plasma polymer, and silicon organic compound plasma polymer such as hexamethyldi-silazane plasma polymer can be used. When an amorphous carbon nitride (a-CNx:H) film is used as the plasma polymerized film 47, the film is formed by a polymerization method using a mixture of methane gas and nitrogen gas as a raw material. When furan plasma gas is used, the film is formed by a plasma polymerization method using vaporized furan as a raw material. When the polymer film 47 is formed using these plasma polymerization methods, it is possible to reliably prevent damage of the organic EL element caused by heat generated at the time of film formation because the substrate can be maintained at room temperature.

On the other hand, the vapor deposition inorganic film 48 can be formed by a nitrogen film such as silicon nitride ($Si_3N_4$ film), aluminum nitride, and boron nitride, an oxide film such as silicon oxide ($SiO_2$ film), aluminum oxide ($Al_2O_3$ film), and titanium oxide ($TiO_2$ film, TiCO film, etc.), one of amorphous silicon and diamond like carbon (DLC), or a mixed film including one of these materials. The vapor deposition method includes a plasma CVD (chemical vapor deposition) method, an ALE (atomic layer epitaxial growth) method, a cat (catalyst)-CVD method, or the like. In order to form a silicon nitride film as the vapor deposition inorganic layer 48, the film can be formed by the plasma CVD method using silane gas, nitrogen gas and ammonia gas as raw materials.

Figure 11:
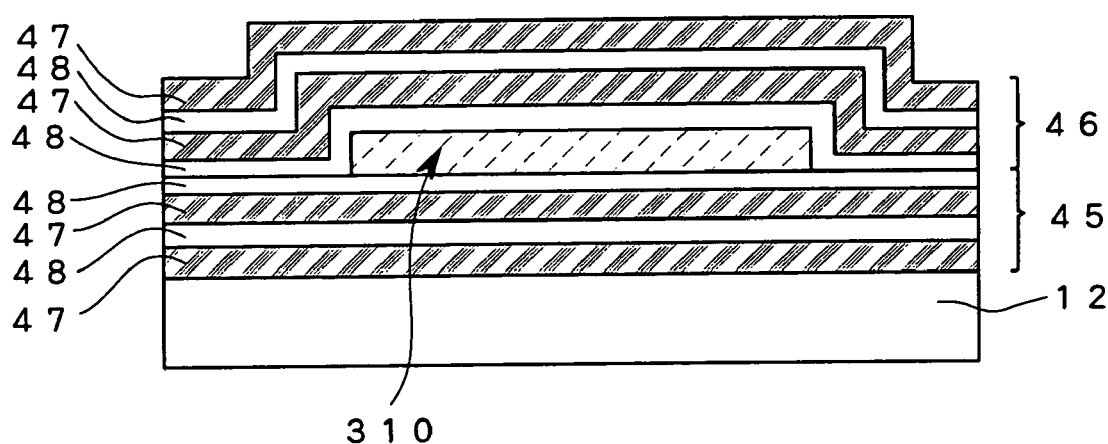
FIG. 11 is a schematic cross sectional view showing a structure of the organic electronic device according to the fourth embodiment a thirteenth example of the present invention.

In the example shown in FIG. 11, the first protective film 45 provided between the substrate 12 and the element region has a four-layer structure of plasma polymerized film/vapor deposition inorganic film/plasma polymerized film/vapor deposition inorganic film, sequentially formed from the substrate side. The number of laminated layers is, however, not limited to four, and a three-layer structure of plasma polymerized film/vapor deposition inorganic film/plasma polymerized film, or four or more layered structure can also be adopted. For example, with ten or more layered structure, moisture proof property can be enhanced. However, when the protective film includes too many layers, the manufacturing cost rises while the protection function remains the same, or transparency may be lowered when the film needs to be transparent. Therefore, the laminated layers preferably number 50 or less.

In the example shown in FIG. 11, the second protective film 46 which covers the organic EL element also has a four-layer structure of plasma polymerized film/vapor deposition inorganic film/plasma polymerized film/vapor deposition inorganic film, sequentially formed from the substrate side. The number of laminated layers is, however, not limited to four, and a three-layer structure of plasma polymerized film/vapor deposition inorganic film/plasma polymerized film, or four or more layered structure can also be adopted. For example, with ten or more layered structure, moisture proof property can be enhanced. However, when the protective film includes too many layers, the manufacturing cost rises while the protection function remains the same, or optical transparency may be lowered. Therefore, the laminated layers preferably number 50 or less.

In order to reliably prevent occurrence of cracks or the like in the vapor deposition inorganic film caused by bending stress and thermal stress, it is desirable to form both the first and second protective films 45 and 46 in at least three-layer structure of plasma polymerized film/vapor deposition inorganic film/plasma polymerized film.

Further, the following advantages can be obtained when the number of laminated layers in the first and second protective films 45 and 46 is determined such that the innermost layer with respect to the organic EL element is the vapor deposition inorganic layer 48 and the outermost layer with respect to the organic EL element is the plasma polymerized film 47 in both protective layers.

The outermost layer will first be described. In the first protective film 45, by forming the plasma polymerized film 47 as the outermost layer (on the substrate side), it is possible to maintain a high level of adhesion between the substrate using a plastic material or the like and the plasma polymerized film 47 including an organic compound for a long time. This is because, when compared to the vapor deposition inorganic film, the plasma polymerized film 47 including an organic compound has a smaller difference in the thermal stress with respect to the plastic substrate 12 and is resistant to being peeled off the substrate, and, because the plasma polymerized film 47 is relatively soft and has high stress relaxation function, it is further resistant to peeling off during deformation of the substrate.

With regard to the second protective film 46, by placing the plasma polymerized film 47 as the outermost layer (on the external side), the plasma polymerized film 47 will be able to provide high adhesion to a protective layer which will be further provided on the protective film 46 by a coating material. This is very effective in a case where, because sufficient mechanical strength cannot be obtained by covering the organic EL element on the opposite side of the substrate only with the above-described second protective film 46 and the element is likely to be damaged by an external force such as friction and impact, it is necessary to provide a hard coating material or the like on the second protective film 46. Namely, while many of the materials used in the vapor deposition inorganic film have low adhesion to a coating material and an adhesive including an organic compound, the plasma polymerized film 47 including an organic compound has excellent adhesion to these coating material and adhesive. Accordingly, by providing the plasma polymerized film 47 as the outermost layer of the second protective film 46, it is possible to apply a coating material directly on the second protective film 46 and to adhere a film-like coating material to the second protective film 46.

It should be noted that a coating material which can be formed on the second protective film 46 is not particularly limited, and acrylic, fluorine, silicone, rubber or hybrid type coating materials can be used.

Further, a coating material which can be adhered onto the second protective film 46 includes a film-like coating film. For example, an aromatic nylon film (oriented or not-oriented), a PET film, an EVOH (ethylene-vinyl alcohol) film, a polyethylene film may be used. In addition, as an adhesive for bonding these films onto the second protective film 46, various resins including a light curing resin, thermosetting resin, epoxy resin, or the like can be used.

Next, the layer of the first and second protective films 45, 46 provided on the element region side (i.e., the innermost layer) will be described. Although the innermost layer may be either the plasma polymerized film 47 or the vapor deposition inorganic film 48, in the embodiments of the present invention, the vapor deposition inorganic film 48 is provided as the innermost layer both in the first and second protective films 45 and 46.

Figure 12:
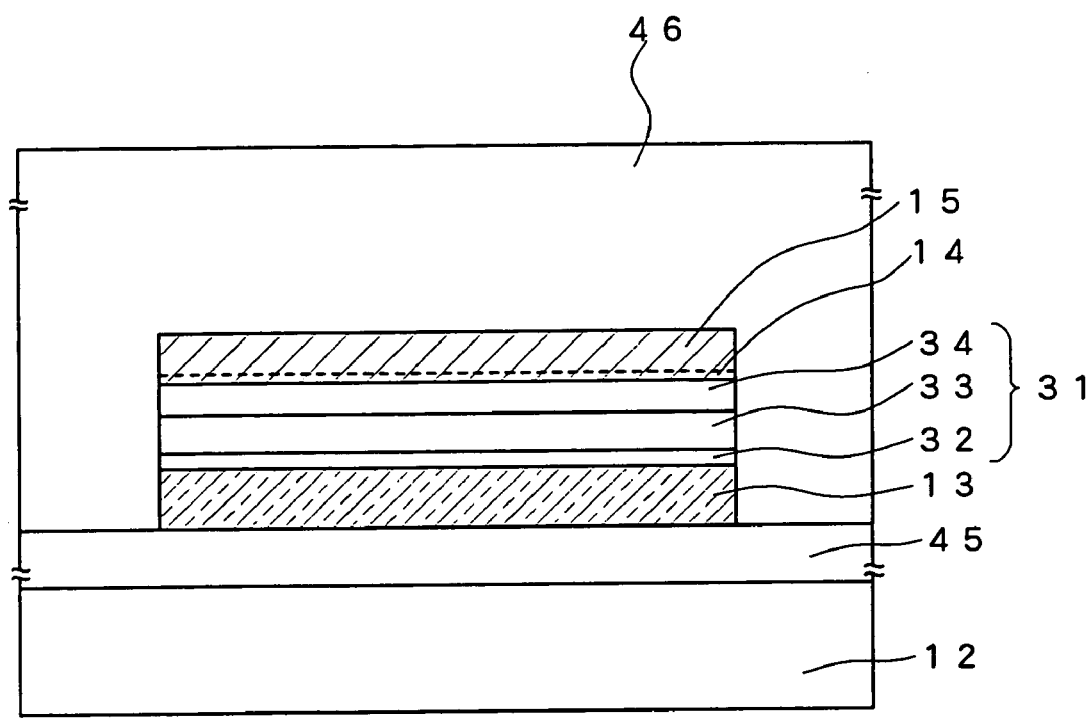
FIG. 12 is a schematic cross sectional view showing a structure of the organic EL element according to the fourth embodiment and thirteenth to seventeenth examples of the present invention.

As schematically shown in FIG. 12, in an organic EL element, an organic compound layer 31 is formed between first and second electrodes 12 and 15, and the first and second electrodes 12, 15 are in contact with the innermost layers of the first and second protective films 45 and 46, respectively.

A SiN film, which is an example of the vapor deposition inorganic film 48, has high absorptivity to a surface of a metal material or the like because its raw material, silane, is chemically active. The absorptivity of a SiN film is higher than that of an a-CNx:H film of the plasma polymerized film 47. Because many of the materials used for the vapor deposition inorganic film 48 have such a property, when the innermost layer of the protective film is formed by the vapor deposition inorganic film 48, the protective film can provide high adhesion to the first and second electrodes 12 and 15 of the organic EL element which are made of a metal or metal oxide. Further, by covering the side surfaces of the organic EL element with the vapor deposition inorganic film 48, which has higher shielding ability against moisture or the like than the plasma polymerized film 47, and reliably preventing intrusion of external moisture or the like into the organic compound layer from the element side surfaces, the organic compound layer 31 can be protected more reliably.

The plasma polymerized film 47, when formed by an a-CNx:H film for example, may have dependency on the underlying layer. The plasma polymerized film 47 which is made of such a material can be more dense and have higher shielding against moisture and oxygen, when a dense film such as a SiN film is provided as the underlying layer. Accordingly, an improved function can be obtained when the vapor deposition inorganic layer 48 is used as the innermost layer (a layer provided on the organic EL element side) at least for the second protective film 46 which covers the organic EL element.

When both the innermost layers of both the first and second protective films 45, 46 are formed using the vapor deposition inorganic films 48, it is preferable that these vapor deposition inorganic films 48 are made of the same material so as to prevent stress generation at their interface.

For the above-described reasons, it is preferable that, in both the first and second protective films, the layer located on the organic EL element side is the vapor deposition inorganic layer 48.

The thickness of each of the plasma polymerized film 47 and the vapor deposition inorganic film 48 in the first and second protective films 45, 46 will be described. As described above, the vapor deposition inorganic film 48 is more influenced by stress and reduces its bending stress durability or the like as the thickness of the film increases. On the other hand, because the vapor deposition inorganic film 48 forms a laminate structure with the plasma polymerized film 47 having excellent bending stress durability, it is not necessary to cover the step of the organic EL element only with the vapor deposition inorganic film. It is therefore preferable that the vapor deposition inorganic film 48 has a thickness of at least 0.5 µm or less so as to provide as high bending stress durability as possible, and preferably has a smaller thickness of approximately 0.15 µm, for example. Here, the thickness of 0.5 µm substantially corresponds to the total film thickness of a normal organic EL element and may seem to be thin. However, because the vapor deposition inorganic film 48 is formed by a vapor deposition method, even a relatively thin film can reliably cover the steps. In addition, because the vapor deposition inorganic film 48 forms a multi-layer laminate structure with the plasma polymerized film 47, sufficient moisture proofing property and step covering property can be achieved by the protective film as whole, even when the vapor deposition inorganic layer 48 is a single thin layer.

The plasma polymerized film 47, on the other hand, need not be thin because it has a high bending stress durability as described above, and it is sufficient to adjust the thickness of the plasma polymerized film 47 such that the total thickness of the second protective film 46 can sufficiently cover the steps of the organic EL element. For example, the plasma polymerized film 47 can have a thickness of approximately 0.5 µm. Further, when the plasma polymerized films 47 are formed with the vapor deposition inorganic film 48 interposed therebetween, it is necessary to cancel warping or the like caused by thermal stress between the plasma polymerized film 47 and the inorganic film 48. It is therefore preferable that at least the plasma polymerized films 47 sandwiching the inorganic layer 48 are formed by the same material to have the same thickness.

The second protective film 46 covering the organic EL element preferably has a total thickness corresponding to at least approximately the total thickness of the organic EL element (approximately 0.5 µm in many cases), and sufficient protection effect can be obtained when the second protective film 46 has at most approximately 10 µm. With the second protective film 46 having such a thickness range, it is possible to sufficiently cover the steps of the organic EL element and provide resistance to moisture.

While a plastic material has been described as an example of the substrate 12 in the above example, the substrate 12 is not limited to a plastic substrate, and a thin glass substrate, a semiconductor substrate, an insulator substrate, or the like, which are easy to bend, can also be used. Even a material with substantially small deformation, such as glass, would be bent easily and be flexible, when it is formed as a very thin substrate or as a substrate formed by lamination of such a thin glass substrate and plastic film. Therefore, when an organic electronic element is formed on such a substrate, it is similarly possible to obtain increased reliability and extended life of the element by using a protective film which has a laminate structure formed by plasma polymerized films sandwiching a vapor deposition inorganic film as described above and which has an excellent bending stress durability and moisture proof property. It should be noted that, although the protective film of the present invention is ideal for protection of the organic electronic element which is formed on a flexible substrate, similar significant effects can, of course, be achieved even when, for example, the film is used for protecting an organic electronic element formed on a glass substrate having a normal thickness with less deformation.

Further, while an organic EL element has been described as an example of an organic electronic element, the protective film can similarly provide a significant effect when used for other elements requiring protection from moisture and oxygen, such as, for example, an organic transistor using an organic material as a material of the active layer, an element using liquid crystal which is an organic compound, or the like.

EXAMPLES 1 TO 7

Hereinafter, examples in which an adhesion layer of the present invention including amorphous carbon nitride was adopted in a laminate structure having an organic member formed on an inorganic member, will be described as Examples 1 and 2. In subsequent Examples 3, 4, 5, and 6, a laminate structure having an inorganic member formed on an organic member will be described. In Example 7, a laminate structure formed by a base member which has adhesion difficulty and an adhesive will be described.

EXAMPLE 1

In Example 1, a glass substrate was used as an inorganic member, and an amorphous carbon nitride film having a thickness of 200 nm was formed on the glass substrate as an adhesion layer. On this amorphous carbon nitride film, a nylon film was attached using an ultraviolet curing resin (WORLD LOCK manufactured by Kyoritsu Kagaku, No. 8723K7C) which is an organic member. The amorphous carbon nitride film was formed by a plasma CVD method using methane gas and nitrogen gas as raw materials. The pressure within a film forming chamber was 200 mTorr (1 Torr≈133 pa), the flow rate of methane gas was 10 sccm, the flow rate of nitrogen gas was 5 sccm, and plasma introduction power was 20 W. The temperature of the glass substrate at the time of film formation was set to room temperature. A #7059 substrate from Corning (surface optical polished product) was used as the glass substrate.

As a comparative Example 1, on the same glass substrate as used in Example 1, a nylon film was directly attached using the same ultraviolet curing resin.

The laminate product of Example 1 and the laminate product of the Comparative Example 1 were left to stand for 1000 hours under the environment of 65° C. and humidity of 95% RH. As a result, no abnormalities such as film peel-off were observed in the laminate product of Example 1, whereas in the laminate product of the Comparative Example 1, the glass substrate and the ultraviolet curing resin were peeled off from each other.

EXAMPLE 2

In Example 2, a glass substrate which is similar to that used in Example 1 was used as an inorganic material. On the glass substrate, an amorphous carbon nitride film having a thickness of 200 nm was formed under the same conditions as in Example 1. Then, on this amorphous carbon nitride film, a furan plasma polymerized film which is an organic member was formed to have a film thickness of 2 μm using furan monomer as a raw material under the condition of the pressure of 200 mTorr, plasma introduction power of 20 W, and the base member temperature at a room temperature.

As a Comparative Example 2, on the glass substrate similar to that used in Example 2, a furan plasma polymerized film was directly formed under the same film formation conditions as in Example 2.

The laminate product of Example 2 and the laminate product of Comparative Example 2 were left to stand for 1000 hours under the environment of 65° C. and humidity of 95% RH. As a result, no abnormalities such as film peel-off were observed in the laminate product of Example 2, whereas in the laminate product of Comparative Example 2, peel-off and cracks were observed for the furan film.

EXAMPLE 3

In Example 3, an acrylic substrate was used as a base member. On this acrylic substrate, an amorphous carbon nitride film was formed on the same conditions as those in Example 1. Then, a silicon oxide film having a thickness of 500 nm was formed on the amorphous carbon nitride film with the $SiO_2$ target by an RF magnetron sputtering method using $Ar/O_2$ mixed gas (mixture ratio=7:3) under the conditions in which the pressure was 3 mTorr and the base member was held at a room temperature.

As a comparative Example 3, on the same acrylic substrate as in Example 3, a silicon oxide film was directly formed under the same conditions as in Example 3.

The laminate product of Example 3 and the laminate product of Comparative Example 3 were left to stand for 1000 hours under the environment of 65° C. and humidity of 95% RH. As a result, no abnormalities such as film peel-off were observed in the laminate product of Example 3, whereas in the laminate product of Comparative Example 3, cracks occurred in the silicon oxide film.

The above acrylic substrate can be used as a substrate for a liquid crystal display device or a plastic window base member, for example. It is desirable that a surface of such a base member be covered for protection with an $SiO_2$ layer which functions as a hard coat layer as in Example 3. However, as is obvious from the durability test in Comparative Example 3, sufficient durability of the hard coat layer cannot be obtained when the silicon oxide film is directly formed on the acrylic substrate by sputtering. By forming an amorphous carbon nitride film between the acrylic substrate and the hard coat layer such as a silicon oxide film as in Example 3, on the contrary, it is possible to enhance adhesion of the silicon oxide film to the acrylic substrate.

EXAMPLE 4

In Example 4, a poly (methyl methacrylate) substrate was used as a base member, and an amorphous carbon nitride film was formed on this substrate under the same conditions as in Example 1. On the amorphous carbon nitride film, a silicon oxide film having a thickness of 500 nm was formed under the same conditions as in Example 3.

As a comparative Example 4, a silicon oxide film was directly formed on the same poly (methyl methacrylate) substrate as used in Example 4 under the same conditions as in Example 4.

The laminate product of Example 4 and the laminate product of Comparative Example 4 were left to stand for 1000 hours under the environment of 65° C. and humidity of 95% RH. As a result, no abnormalities such as film peel-off were observed in the laminate product of Example 4, whereas in the laminate product of Comparative Example 4, cracks occurred in the silicon oxide film.

The above poly (methyl methacrylate) substrate has a superior transparency and is used for a plastic lens base member, for example. It is desirable that the durability of a hard coat layer covering the surface of such a substrate be increased. Accordingly, by forming an amorphous carbon nitride film is formed as an adhesion layer between the poly (methyl methacrylate) substrate and the hard coat layer such as a silicon oxide film, adhesion of the hard coat layer to the poly (methyl methacrylate) substrate is significantly increased, which results in the enhanced durability of the lens or the like.

EXAMPLE 5

In Example 5, a fluorocarbon resin (more specifically, polytetrafluoroethylene) substrate was used as a base member, and an amorphous carbon nitride film was formed on this fluorocarbon resin substrate under the same conditions as in Example 1. On the amorphous carbon nitride film, a silicon oxide film having a thickness of 500 nm was formed under the same conditions as in Example 3.

As Comparative Example 5, on the fluorocarbon resin (more specifically, polytetrafluoroethylene) substrate which is the same as in Example 5, a silicon oxide film was directly formed under the same conditions as in Example 5.

The laminate product of Example 5 and the laminate product of Comparative Example 5 were left to stand for 1000 hours under the environment of 65° C. and humidity of 95% RH. As a result, no abnormalities such as film peel-off were observed in the laminate product of Example 5, whereas in the laminate product of Comparative Example 5, the silicon oxide film peeled off.

Although polytetrafluoroethylene has superior chemical stability and is often used for a coating layer, polytetrafluoroethylene peels easily because of low adhesion to other materials. Further, although it is desirable that a surface of polytetrafluoroethylene, which is a soft material, be covered with a harder material, when a silicon oxide film was directly formed on a polytetrafluoroethylene surface as in Comparative Example 5, the silicon oxide film would be peeled off because of low adhesion. However, as can be recognized from the result of Example 5, by using an amorphous carbon nitride film according to the present invention as an adhesion layer, adhesion between a polytetrafluoroethylene substrate and a coating member such as a silicon oxide film can be enhanced.

EXAMPLE 6

In Example 6, a glass substrate which is similar to that used in Example 1 was used as a base member, and a color filter was formed on this glass substrate using a CFPR resist manufactured by Tokyo Ohka Kogyo Co., Ltd. On the color filter, an amorphous carbon nitride film having a thickness of 200 nm was formed under the same conditions as in Example 1, and a silicon oxide film having a thickness of 500 nm is further formed thereon under the same conditions as in Example 3.

As a comparative Example 6, on the same glass substrate as in Example 6, a silicon oxide film is directly formed under the same conditions as in Example 6.

The laminate product of Example 6 and the laminate product of Comparative Example 6 were left to stand for 1000 hours under the environment of 65° C. and humidity of 95% RH. As a result, no abnormalities such as film peel off were observed in the laminate product of Example 6, whereas in the laminate product of Comparative Example 6, cracks were generated in the silicon oxide film.

Figure 2A:
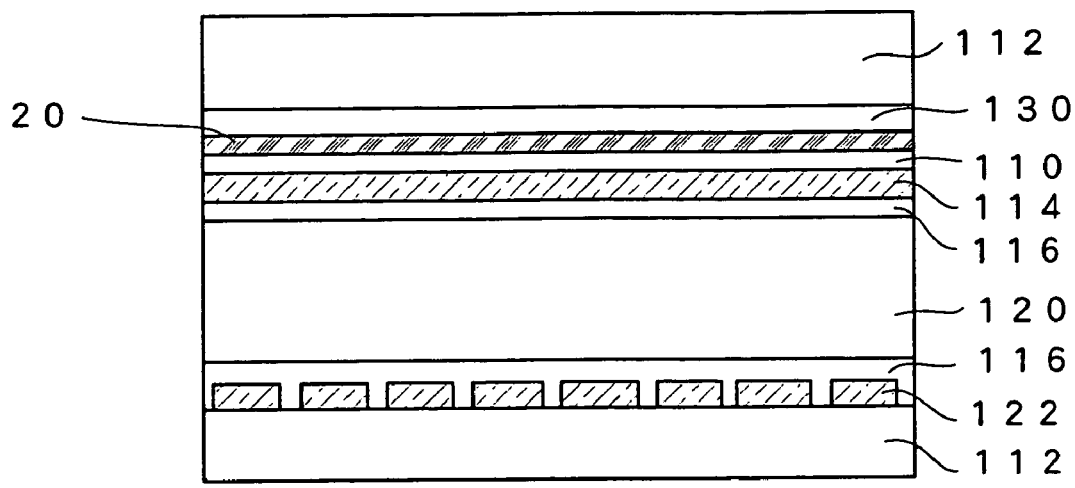
FIG. 2A is a view showing an application example of the laminate product structure according to a sixth example of the present invention.

A laminate structure formed by a color filter and a silicon oxide film is often used in a liquid crystal display device, an organic electroluminescence device, or the like. FIG. 2A shows an example in which a laminate structure having an adhesion layer as described in Example 6 is applied to a liquid crystal display device.

Such a liquid crystal display device comprises a pair of transparent substrates 112 having electrodes 114, 122 and alignment films 116 covering these electrodes formed on the respective opposing surfaces, and liquid crystal 120 which is sealed between these substrates 112. In a liquid crystal display device for color display, a color filter (CF) 130 is formed on one of the substrates (a glass substrate or a film substrate) 112, and on the surface of this substrate 112 facing the liquid crystal, a transparent electrode 114 made of ITO or the like is formed for driving the liquid crystal between this electrode 114 and the electrode 122 of the other substrate 112. Here, between this transparent electrode 114 and the color filter 130, a silicon oxide ($SiO_2$) film 110 may be formed as an insulating film for insulation protection of the transparent electrode 114, for example. In this regard, when a silicon oxide film which is an inorganic member is directly formed on a color filter which is an organic member, adhesion is insufficient, as in the case of Comparative Example 6. When an amorphous carbon nitride film is formed as an adhesion layer 20 between the color filter 130 and the silicon oxide film 110 as shown in FIG. 2A, however, adhesion between the color filter and the silicon oxide film is increased as can be understood from the characteristics of Example 6, and further, a protection ability to enhance shielding against intrusion of moisture, oxygen, or impurities into the liquid crystal layer from the color layer can be provided. It is therefore possible to enhance durability and reliability of the device, such as resistance to high temperatures. In some cases, a transparent electrode is directly formed on the color filter without providing a silicon oxide film. Even in such a case, adhesion between the color filter which is an organic member and the transparent electrode can be enhanced by providing an amorphous carbon nitride film according to the present invention as an adhesion film between these layers.

Figure 2B:
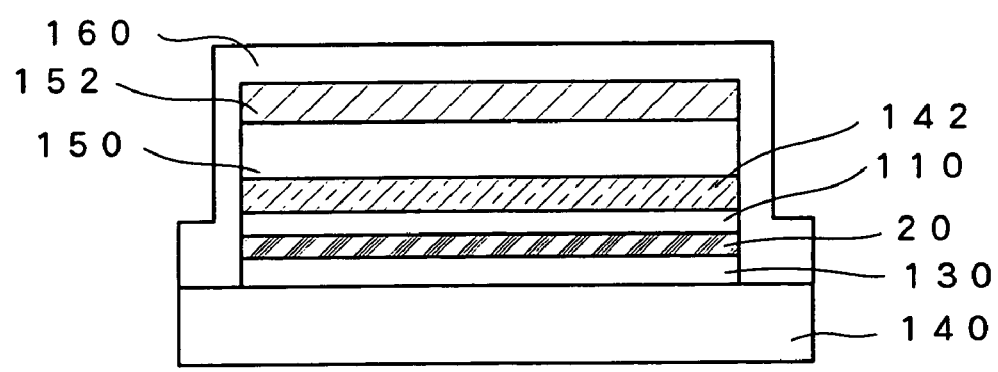
FIG. 2B is a view showing another application example of the laminate product structure according to the sixth example of the present invention.

FIG. 2B shows an example in which a laminate structure as described in Example 6 is applied to an organic electroluminescence device. An organic EL device includes an element having an organic layer 150 which includes an organic emissive material between electrodes 142 and 152. When color display is achieved using an organic emissive material which emits light of a single color (for example, white), colors filters 130 of R, G, and B are provided on the light emission side. In this case, as in the case shown in FIG. 2A, on the color filter 130, which is an organic member formed on a transparent substrate 140 such as a glass or film substrate, a transparent electrode 142 such as ITO which forms one electrode of the organic EL element is layered via a silicon oxide film 110 or the like. (The silicon oxide film may be omitted in some cases). When an amorphous carton nitride film 20 is formed as an adhesion layer between the color filter 130 and the silicon oxide film 110 or the transparent electrode 142, adhesion between these layers can be enhanced, and, at the same time, a protective ability for enhancing the shielding against intrusion of moisture, oxygen, or impurities into the organic layer from the color layer can be provided, which can significantly contribute enhancement of durability and reliability of the organic EL device. In the organic EL device shown in FIG. 2B, a protective film 160 is provided so as to cover the entire device from above the electrode 152 which is the uppermost layer of the organic EL element.

EXAMPLE 7

In Example 7, a glass substrate which is similar to that used in Example 1 was used as a base member, and an amorphous carbon nitride film having a thickness of 200 nm was formed on this glass substrate under the same conditions as in Example 1. On the other hand, an amorphous carbon nitride film was formed on a surface of a polyethylene film under the same conditions as in Example 1. The polyethylene film and the glass substrate were then attached to each other in such a manner that the amorphous carbon nitride films on the respective surfaces of the polyethylene film and the glass substrate faced each other and were bonded to each other using an epoxy resin (Araldite standard manufactured by NICHIBAN CO., LTD.) applied on the amorphous carbon nitride films.

As Comparative Example 7, an amorphous carbon film is formed on a glass substrate, and a polyethylene film is directly attached on the substrate using an epoxy resin.

The laminate product (adhesive product) of Example 7 and the laminate product (adhesive product) of Comparative Example 7 were left to stand for 1000 hours at a temperature of 65° C. and humidity of 95% RH. As a result, no abnormalities such as film peel-off were observed in the laminate product of Example 7, whereas in the laminate product of Comparative Example 6, the polyethylene film and the epoxy resin were peeled off from each other.

As is obvious from Comparative Example 7, the polyethylene film has low adhesion to the epoxy resin. By forming an amorphous carbon nitride film between the polyethylene film and the epoxy resin, adhesion between these layers can be reliably achieved.

EXAMPLES 8 TO 12

Examples 8 to 12 and Comparative Examples 8 to 10 will be described. In Examples 8 to 11, and Comparative Examples 8 and 9, organic EL elements having the same structure were used.

Referring to FIG. 5, the element portion of the organic EL element was formed by sequentially laminating, on a glass substrate 11, a first electrode 13, a hole injection layer 32, a hole transport layer 33, a hole transport layer 34, and a second electrode 15 having an electron injection layer 14 in this order. The organic EL elements used in Example 12 and Comparative Example 10 also have the same structure except that a film substrate 12 made of polyethylene terephthalate (PET) was used in place of the glass substrate.

More specifically, in Examples 8 to 12 and Comparative Examples 8 to 10, the organic EL element includes, on the substrate 10 (or substrate 11), ITO (Indium Tin Oxide) having a thickness of 150 nm as the first electrode 13, copper phtalocyanine (CuPc) having a thickness of 10 nm as the hole injection layer 32, triphenylamine tetramer (TPTE) having a thickness of 50 nm as the hole transport layer 33, quinolonol aluminum complex (Alq$_3$) having a thickness of 60 nm as the hole transport layer 34, lithium fluoride (LiF) having a thickness of 0.5 nm as the electron injecting layer 14, and aluminum (Al) having a thickness of 100 nm as the second electrode 15, which are formed on the substrate 10 (or substrate 11). In Examples 8 to 11, and Comparative Examples 8 and 9, a glass substrate on which ITO was previously formed was used, and each layer other than ITO was formed in-situ (ultrahigh vacuum process) using a vacuum evaporation method.

EXAMPLE 8

In Example 8, a single layer formed by an a-CNx:H film was used as a protective film covering the organic EL element. The cross sectional structure shown in FIG. 5 corresponds to that of the organic EL element according to Example 8. In Example 8, an a-CNx:H was formed by a plasma enhanced chemical vapor deposition method using methane gas and nitrogen gas as raw materials so as to cover the organic EL element from the second electrode 15 side. During film formation, the pressure was 200 mTorr (1 Torr≈133 pa), the flow rate of methane gas was 10 sccm, the flow rate of nitrogen gas was 5 sccm, the plasma introduction power was 20 W, and the temperature of the substrate was set to a room temperature. The a-CNx:H film was formed to have a thickness of 2 μm.

EXAMPLE 9

In Example 9, as shown in FIG. 6 described above, the protective film 40 covering the organic EL element has a laminate structure formed by an a-CNx:H film 41 and a SiN film 43. More specifically, the a-CNx:H film 41 was first formed so as to cover the organic EL element from the second electrode 15 side, and the SiN film 43 was then formed thereon. The thickness of the a-CNx:H film 41 was 2 μm and was formed under the conditions similar to those in Example 8. The SiN film 43 was formed by a plasma CVD method using silane gas, ammonia gas, and nitrogen gas as raw materials. During the SiN film formation, the pressure was 400 mTorr, the flow rate of silane gas was 30 sccm, the flow rate of ammonia gas was 30 sccm, the flow rate of nitrogen gas was 250 sccm, the plasma introduction power was 10 W, and the temperature of the substrate was set to 100° C. The SiN film was formed to have a thickness of 0.1 μm.

EXAMPLE 10

In Example 10, as shown in FIG. 7 described above, the protective film 40 covering the organic EL element has a structure in which a SiN film 43 and an a-CNx:H film 41 were laminated in this order from the organic EL element side. Although the order of film lamination differed, the film formation conditions and the film thicknesses are the same as those in Example 9.

EXAMPLE 11

In Example 11, as shown in FIG. 8 described above, the protective film 40 covering the organic EL element has a three-layer structure of SiN film 43/a-CNx:H film 41/SiN film 43 which are sequentially provided from the organic EL element side. Both the SiN film covering the organic EL element and the SiN film which is the uppermost layer had a thickness of 1 μm and were formed under the same conditions as in Example 2. The a-CNx:H film 41 was formed to have a thickness of 2 μm under the same conditions as in Example 8.

EXAMPLE 12

In Example 12, as shown in FIG. 9, a PET film substrate 12 was used as a substrate used for forming an organic EL element. On this film substrate 12, as a protective film (buffer layer) 21, an a-CNx:H film 42 having a thickness of 2 μm was formed covering the substrate and a SiN film 44 having a thickness of 0.1 μm was then formed to cover the a-CNx:H film 42. The film formation method was the same as that in each of the above examples. Further, on the SiN film 44, an organic EL element was formed as in each of the above examples. Then, a protective film 40 was formed covering the organic EL element. The protective film 40 was formed by sequentially laminating, from the element side, a SiN film 43 having a thickness of 1 μm and an a-CNx:H film 41 having a thickness of 2 μm in a manner similar to Example 3 under the same conditions as in Example 3.

COMPARATIVE EXAMPLE 8

In Comparative Example 8 corresponding to the above Example 8, a SiN film which was an inorganic protective film having a thickness of 2 μm was formed using a plasma CVD method as a protective film for covering the organic EL element formed on the glass substrate. The conditions for forming the SiN film were otherwise as described above.

COMPARATIVE EXAMPLE 9

In Comparative Example 9, a polyparaxylene film which was an organic protective film having a thickness of 2 μm was formed using a CVD method, as a protective film for covering the organic EL element formed on the glass substrate.

COMPARATIVE EXAMPLE 10

In Comparative Example 10, an a-C:H (amorphous carbon) film having a thickness of 2 μm was formed as a protective film for covering the organic EL element formed on the glass substrate by a plasma CVD method using methane gas as a raw material.

[Evaluation]
The samples of the above examples and comparative examples thus formed were annealed in the atmosphere at 100° C. for one hour. The sample of Example 5 in which a film substrate was used was, however, annealed at 60° C. for one hour. After annealing under the above conditions, a high temperature test and a high humidity test were performed.

In the high temperature test, each organic EL element was caused to emit light for 1000 hours under an environmental temperature of 85° C., and the changing rate in the emissive area before and after exposure was measured. In the high humidity test, each sample was left to stand under the conditions of the temperature at 65° C. and the humidity of 95% RH for 100 hours, and the changing rate in the emissive area before and after exposure was measured. The results are shown in Table 1.

TABLE 1

|  | High temperature test (%) | High humidity test (%) |
|---|---|---|
| Example 8 | 89 | 81 |
| Example 9 | 95 | 90 |
| Example 10 | 98 | 93 |
| Example 11 | 99 or more | 99 or more |
| Example 12 | 85 | 80 |
| Comparative Example 8 | 0 | 99 or more |
| Comparative Example 9 | 66 | 32 |
| Comparative Example 10 | 82 | Peeled off |

With all of Examples 8 to 12, over 80% of the emissive was maintained after both the high temperature and high humidity tests. The Comparative Examples 8 to 10, however, could only provide results in which the emissive area was below 50% for either the high temperature or high humidity test. More specifically, when only a SiN inorganic film was provided as a protective film as in Comparative Example 8, while the product showed high resistance under the high humidity conditions, the whole region became non-emissive as a result of the high temperature test. On the other hand, when only an a-C:H film was adopted as in Comparative Example 8, while a preferable result of 82% could be obtained under the high temperature, the protective film was peeled off as a result of the high humidity test. It can therefore be understood that a single layer formed by a SiN film and an single layer formed by an a-C:H film is not suitable for an in-vehicle device which requires high resistance to at least temperature and humidity. Further, when a polyparaxylene film was used as a protective film as in Comparative Example 9, although the results of both the high temperature test and the high humidity test were not bad (approximately 0%), the values of 66% for the high temperature test and of 32% for the high humidity test were both insufficient. Accordingly, the protective film in Comparative Example 9 is also not suitable for an in-vehicle device which requires high resistance to temperature and humidity.

In contrast to the comparative examples, the a-CNx:H film which is an organic member according to the present invention can provide a preferable result of 89% for the high temperature test and 81% for the high humidity test, even when it was used in a single layer structure as in Example 8. Further, when a two-layer structure formed by an a-CNx:H film and a thin SiN film was used as in Examples 9 and 10, the enhanced function of the protective film was made clear. It can be understood that the higher effect can be achieved when these two films were laminated in the order employed in the Example 10. In addition, in the Example 11 in which a protective film having a three-layer structure of SiN/a-CNxH/SiN was used, a stable emissive area of 99% or more was achieved after both the high temperature and high humidity tests, and it can be seen that such a protective film is especially effective as a protective film of an organic EL element for an in-vehicle use.

Further, in the element of the Example 12 using a film substrate, the emissive area of 85% after the high temperature test and the emissive area of 80% after the high humidity test were achieved. These results show that it is possible to drastically increase resistance of the organic EL element to the high temperature and high humidity due to the protective films 21 and 40 used in the Example 12, even when a film substrate which has an inferior shielding ability with respect to moisture and oxygen compared to a glass substrate is used.

EXAMPLES 13 TO 17

Organic EL devices according to Examples 13 to 17 and organic EL devices according to Comparative Examples 11 to 15 will next be described.

In all these examples and the comparative examples, the organic EL elements formed on a substrate have the same structure. As shown in FIG. 12, each organic EL element was formed by sequentially laminating a first electrode 13, a hole injection layer 32, a hole transport layer 33, a hole transport layer 34, and a second electrode 15 having an electron injection layer 14 in this order from the substrate 11 side.

More specifically, in Examples 13 to 17 and Comparative Examples 11 to 15, the organic EL element includes ITO (Indium Tin Oxide) having a thickness of 150 nm as the first electrode 13, copper phtalocyanine (CuPc) having a thickness of 10 nm as the hole injection layer 32, triphenylamine tetramer (TPTE) having a thickness of 50 nm as the hole transport layer 33, quinolonol aluminum complex ($Alq_3$) having a thickness of 60 nm as the hole transport layer 34, lithium fluoride (Lif) having a thickness of 0.5 nm as the electron injection layer 14, and aluminum (Al) having a thickness of 100 nm as the second electrode 15, which are sequentially formed from the substrate 11 side. The layers other than ITO were sequentially formed (in-situ) using a vacuum evaporation method.

Further, in each of the examples and the comparative examples, a film substrate 12 made of polyethylene terephthalate (PET) was used as a flexible substrate.

EXAMPLE 13

In the Example 13, an organic EL device having a laminate structure as shown in FIG. 11 was formed on a PET film substrate 12. More specifically, from the substrate side, "a PET film substrate 12", "a plasma polymerized film 47/a vapor deposition inorganic film 48/a plasma polymerized film 47/a vapor deposition inorganic film 48", "an organic EL element", "a vapor deposition inorganic film 48/a plasma polymerized film 47/a vapor deposition inorganic film 48", and "a plasma polymerized film 47" were sequentially formed.

For each plasma polymerized film 47, an amorphous carbon nitride (a-CNx:H) film having a thickness of 500 nm was used. Further, for each vapor deposition inorganic film 48, a silicon nitride film having a thickness of 150 nm was used.

The amorphous carbon nitride film was formed by a plasma polymerization method using a mixed gas of methane gas and nitrogen gas (a mixture ratio=2:1) as a raw material. During the film formation, the pressure was 200 mTorr (1 Torr≈133 pa), the plasma introduction power was 20 W, and the temperature of the substrate was set to a room temperature.

The silicon nitride film was formed by a plasma CVD method using a mixed gas of $SiH_4$ gas, $NH_3$ gas, and $N_2$ gas (a mixture ratio=3:3:25) as raw materials. During the film formation, the pressure was 400 mTorr (1 Torr≈133 pa), the plasma introduction power was 10 W, and the temperature of the substrate was 100° C.

EXAMPLE 14

The device of Example 14 has the same element structure as in the above Example 13 except that in Example 14, in place of the amorphous carbon nitride film of Example 14, a furan plasma polymerized film having a thickness of 500 nm was used as the plasma polymerized film 47. The furan plasma polymerized film was formed by a plasma polymerization method using vaporized furan as a raw material under the conditions in which the pressure was 200 mTorr (1 Torr≈133 pa), the plasma introduction power was 20 W, and the temperature of the substrate was set to a room temperature.

EXAMPLE 15

In the device of the Example 15, from the substrate side, "a PET film substrate", "a plasma polymerized film/a vapor deposition inorganic film/a plasma polymerized film/a vapor deposition inorganic film/a plasma polymerized film/a vapor deposition inorganic film", "an organic EL element", "a vapor deposition inorganic film/a plasma polymerized film/a vapor deposition inorganic film/a plasma polymerized film/a vapor deposition inorganic film/a plasma polymerized film" were sequentially formed. The device of the Example 15 differs from the device of the Example 13 in that while in the Example 13, the number of layers forming the first protective film 45 provided between the substrate and the organic EL element and the number of layers forming the second protective film 46 covering the organic EL element region are both 4, the number of these layers in the Example 15 are both 6. The devices of Examples 13 and 15 are the same in other respects. Namely, as each plasma polymerized films 47, an amorphous carbon nitride (a-CNx:H) film having a thickness of 500 nm which was formed by a plasma polymerization method was used. Further, as each vapor deposition inorganic film 48, a silicon nitride film having a thickness of 150 nm which was formed by a plasma CVD method was used.

COMPARATIVE EXAMPLE 11

In Comparative Example 11, in a device having a laminate structure in which films are layered in the same order as in the Example 13, the thickness of the vapor deposition inorganic film 48 using silicon nitride was set to 1 μm contrary to the thickness of 0.15 μm in the Example 13. The device of Comparative Example 11 is the same as the device of the Example 13 in other respects.

COMPARATIVE EXAMPLE 12

In Comparative Example 12, from the substrate side, "a PET film substrate", "a plasma polymerized film/a vapor deposition inorganic film" an organic EL element" a vapor deposition inorganic film/a plasma polymerized film" were sequentially formed. For each plasma polymerized film, an amorphous carbon nitride (a-CNx:H) film having a thickness of 500 nm which was formed by a plasma polymerization method was used. Further, for each vapor deposition inorganic film, a silicon nitride film having a thickness of 150 nm which was formed by a plasma CVD method was used.

The device in Comparative Example 12 differs from the devices of Examples 13 to 15 in that in Comparative Example 12, a sandwich structure including a vapor deposition inorganic film between plasma polymerized films is not used either in the first protective film provided between the substrate and the element or in the second protective film covering the element.

COMPARATIVE EXAMPLE 13

In Comparative Example 13, from the substrate side, "a PET film substrate", "a vapor deposition inorganic film/a plasma polymerized film", "an organic EL element", "a plasma polymerized film/a vapor deposition inorganic film" were sequentially formed.

The device in Comparative Example 13 differs from the devices of Examples 13 to 15 in that in Comparative Example 13, a sandwich structure including a vapor deposition inorganic film between plasma polymerized films is not used either in the first protective film provided between the substrate and the element or in the second protective film covering the element, and in that the inorganic layers are formed as the outermost layers with respect to the organic EL element.

(Evaluation of the Examples 13 to 15 and Comparative Examples 11 to 13)

Each organic EL device in the examples 13 to 15 and in Comparative examples 11 to 13 was evaluated concerning the bending stress durability and the high temperature resistance. For evaluation of the bending stress durability, in each element of Examples 13 to 15 and Comparative Examples 11 to 13, the substrate was bent until it had a radius of curvature of 8 mm while the element was caused to emit light, and a change of the state at that time was evaluated. Further, the element was continuously caused to emit light while the radius of curvature of 8 mm was maintained, and a change of moisture proof property was evaluated.

For evaluation of high temperature resistance, the element was caused to emit light at 85° C. without bending the substrate and a change in the moisture proof property of the element was evaluated.

In the device of Comparative Example 11, cracks were generated in the first and second protective films when the radius of curvature of the substrate reached 15 mm, and the moisture proof property was lowered.

In the devices of Comparative Examples 12 and 13, although no cracks were generated when the radius of curvature reached 8 mm, as a result of continuously causing the element to emit light while keeping the radius of curvature of 8 mm, the non-emissive area (dark spots) increased within the original emissive area of the organic EL element after elapse of 300 hours, and deterioration of moisture proof property was observed.

In each device of Examples 13 to 15, on the other hand, cracks were not generated when the radius of curvature reached 8 mm, and as a result of continuously causing the element to emit light for 1000 hours while keeping the radius of curvature of 8 mm, neither the increase of dark spots or the deterioration of moisture proof property was observed. In addition, in the element of Examples 13 to 15, the evaluation of the high temperature resistance also showed no deterioration of moisture proof property for 1000 hours.

From the above evaluation results, the following was found. First, when the thickness of the vapor deposition inorganic film is large as in Comparative Example 11, the bending stress durability cannot be obtained and sufficient moisture proof property cannot be maintained. Therefore, a protective film having such a thick inorganic film is inappropriate when an element is formed on a flexible substrate.

Further, as can be understood from the evaluation results of Comparative Examples 12 and 13 and of Examples 13 to 15, when a laminate structure formed by three or more layers in which a vapor deposition inorganic film is sandwiched between plasma polymerized films is used in a protective film, it is possible to reliably protect an organic electronic element formed on a flexible substrate for a long time. Therefore, when a protective film has such a sandwich structure including a vapor deposition inorganic film sandwiched between plasma polymerized films and the vapor deposition inorganic film is formed at a small thickness, an organic electronic device having an excellent high temperature resistance and also high bending resistance can be generated, and an in-vehicle flexible organic electronic device which can resist a severe environment can be realized, for example.

EXAMPLE 16

In the Example 16, in a device having the same structure as in the Example 13, an acrylic hard coating member having a thickness of 5 µm was further provided on the second protective film 46.

COMPARATIVE EXAMPLE 14

In Comparative Example 14, the uppermost layer of the second protective film 46 of the Example 16 was formed by a vapor deposition inorganic film, not by a plasma polymerized film. More specifically, from the substrate side, "a PET film substrate", "a plasma polymerized film/a vapor deposition inorganic film/a plasma polymerized film/a vapor deposition inorganic film", "an organic EL element", "a vapor deposition inorganic film/a plasma polymerized film/a vapor deposition inorganic film/a plasma polymerized film/a vapor deposition inorganic film" were sequentially formed. Then, on the vapor deposition inorganic film which is the uppermost layer, an acrylic hard coating member having a thickness of 5 µm which is the same as that in Example 4 was provided.

EXAMPLE 17

In the Example 17, in a device having the same structure as in the Example 16, a drawn aromatic nylon film having a thickness of 15 µm, not an acrylic hard coating member, was attached to the second protective film 46 using a light curing resin. The device of the Example 17 has the same structure as in the Example 16 in other respects.

COMPARATIVE EXAMPLE 15

In Comparative Example 15, the uppermost layer of the second protective film 46 in the device having the same structure as in the Example 17 was formed by a vapor deposition inorganic film, not by a plasma polymerized film. More specifically, from the substrate side, "a PET film substrate", "a plasma polymerized film/a vapor deposition inorganic film/a plasma polymerized film/a vapor deposition inorganic film", "an organic EL element", "a vapor deposition inorganic film/a plasma polymerized film/a vapor deposition inorganic film/a plasma polymerized film/a vapor deposition inorganic film" were sequentially formed. Then, a drawn aromatic nylon film having a thickness of 15 µm was attached to the vapor deposition inorganic film which is the uppermost layer, using a light curing resin, as in the Example 5.

(Evaluation of Examples 16 and 17 and Comparative Examples 14 and 15)

The devices of Examples 16 and 17 and the devices of Comparative Examples 14 and 15 were left to stand on the conditions of the temperature at 65° C. and the humidity of 95% RH for 300 hours. As a result, no abnormality in the element, the protective film, or the hard coating member was found in the devices of Examples 16 and 17. In the devices of Comparative Examples 14 and 15, however, abnormality such as peel off between the coating member and the second protective film was observed. From the above result, it is to be understood that it is preferable that, especially when a protective coating member is further provided on the second protective film, the uppermost layer of the second protective film is formed by a plasma polymerized film having a high affinity to such a coating member.

INDUSTRIAL APPLICABILITY

The present invention can be used as an adhesion layer or a protective film for an organic and inorganic member, which is applicable to both an organic member and an inorganic member.

What is claimed is:

1. An organic electronic device comprising, on a base member;
   an organic electronic element comprising at least an electrode and an organic compound layer, and
   one of or both a protective film which is formed covering the organic electronic element and a protective film which is formed between the organic electronic element and the base member,
   wherein the protective film comprises amorphous carbon nitride.

2. An organic electronic device according to claim 1, wherein,
   the film comprising amorphous carbon nitride is formed by a plasma enhanced chemical vapor deposition method using, as a raw material, gas comprising one or more of alkane, alkene, and alkyne, and gas comprising nitrogen and ammonia.

3. An organic electronic device according to claim 1, wherein
   the protective film is a single film made of the amorphous carbon nitride or a laminate film formed by the amorphous carbon nitride and an inorganic film.

4. An organic electronic device according to claim 3, wherein,
   the film comprising amorphous carbon nitride is formed by a plasma enhanced chemical vapor deposition method using, as a raw material, gas comprising one or more of alkane, alkene, and alkyne, and gas comprising nitrogen and ammonia.

5. An organic electronic device according to claim 3, wherein
   the inorganic film comprises one or more of a nitride film, an oxide film, and a silicon film.

6. An organic electronic device according to claim 1, wherein
   the inorganic film is one or more of a silicon nitride film, a boron nitride film, an aluminum nitride film, a silicon oxide film, an aluminum oxide film, a titanium oxide film, and an amorphous silicon film.

7. An organic electronic device according to claim 1, wherein
   the organic electronic element comprises an organic transistor or a liquid crystal element.

* * * * *